US008536677B2

(12) United States Patent  
Baumgartner et al.

(10) Patent No.: US 8,536,677 B2  
(45) Date of Patent: Sep. 17, 2013

(54) CAPACITOR STRUCTURE

(75) Inventors: Peter Baumgartner, Munich (DE); Philipp Riess, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1025 days.

(21) Appl. No.: 12/233,632

(22) Filed: Sep. 19, 2008

(65) Prior Publication Data

US 2009/0009926 A1 Jan. 8, 2009

Related U.S. Application Data

(63) Continuation-in-part of application No. 11/538,227, filed on Oct. 3, 2006, now Pat. No. 7,485,945.

(30) Foreign Application Priority Data

Oct. 4, 2005 (DE) .................. 10 2005 047 409

(51) Int. Cl.  
*H01L 21/02* (2006.01)

(52) U.S. Cl.  
USPC ..... 257/532; 257/503; 257/775; 257/E27.048

(58) Field of Classification Search  
USPC ............... 257/503, 508, 528, 532, 774, 775, 257/920, E27.016, E27.024, E27.048, E27.088, 257/E27.218, E27.342  
See application file for complete search history.

(56) References Cited

U.S. PATENT DOCUMENTS

| | | | | |
|---|---|---|---|---|
| 5,583,359 A * | 12/1996 | Ng et al. | ................ | 257/306 |
| 6,518,604 B1 * | 2/2003 | Worley et al. | ................ | 257/173 |
| 7,023,090 B2 * | 4/2006 | Huang et al. | ................ | 257/756 |
| 7,414,275 B2 * | 8/2008 | Greenberg et al. | ........... | 257/211 |
| 7,482,887 B2 * | 1/2009 | Cyr et al. | ................. | 331/108 C |
| 2003/0206389 A1 | 11/2003 | Hajimiri et al. | | |
| 2004/0004241 A1 * | 1/2004 | Aton | ................ | 257/306 |
| 2006/0071241 A1 * | 4/2006 | Jin | ................ | 257/203 |

* cited by examiner

*Primary Examiner* — Eduardo A Rodela  
(74) *Attorney, Agent, or Firm* — Infineon Technologies AG; Philip Schlazer

(57) ABSTRACT

One or more embodiments relate to a capacitor structure comprising a first and second capacitor electrode. The first electrode may include a conductive strip having at least one wider portion and at least one narrower portion. The second electrode may include a conductive strip having at least one wider portion and at least one narrower portion.

36 Claims, 19 Drawing Sheets

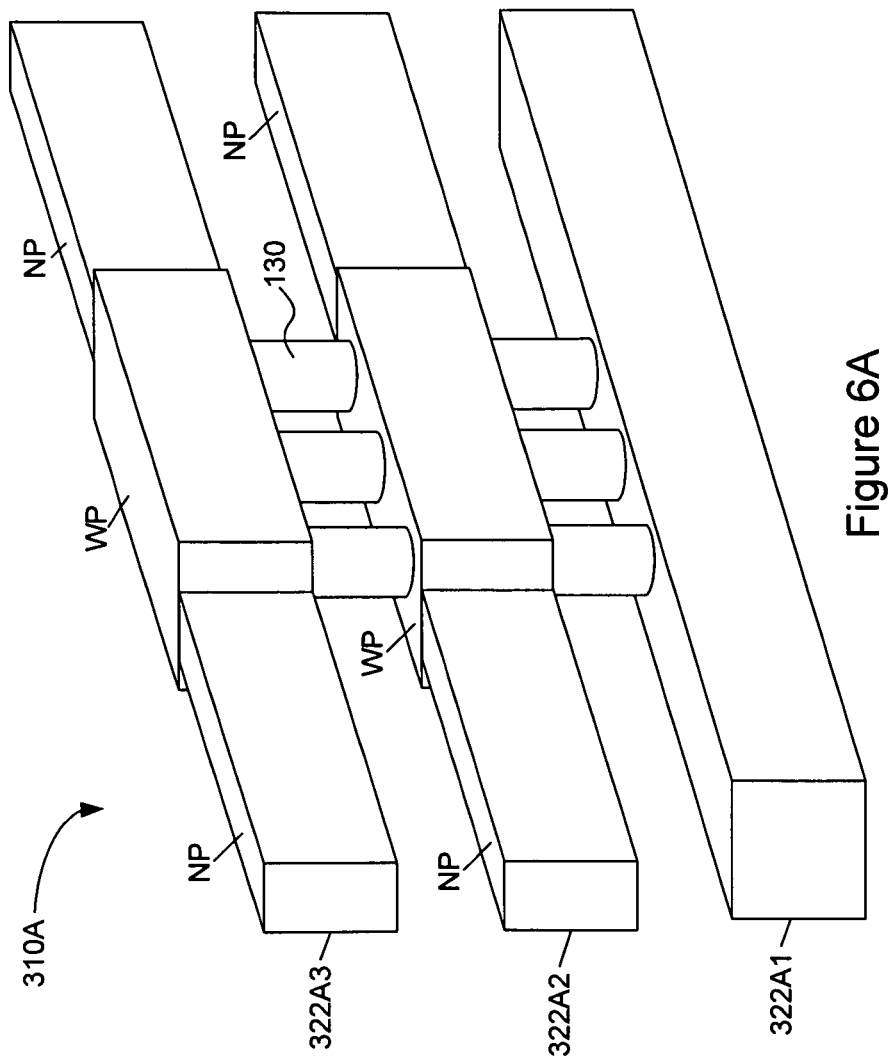

CAPACITOR STRUCTURE

RELATED APPLICATION INFORMATION

This application is a continuation-in-part of U.S. patent application Ser. No. 11/538,227 filed on Oct. 3, 2006, which claims priority under 35 USC 119 from German Application No. 10 2005 047 409.8 filed Oct. 4, 2005.

FIELD OF THE INVENTION

Generally, the present invention relates to semiconductor devices, and, in particular, to semiconductor devices having capacitors.

BACKGROUND OF THE INVENTION

Capacitors may be a part of semiconductor devices. Examples of capacitors include vertical-parallel-plate (VPP) capacitors and metal-insulator-metal (MIM) capacitors. New methods for making capacitors are needed.

SUMMARY OF THE INVENTION

One or more embodiments relate to a semiconductor device, comprising: a capacitor structure comprising: a first capacitor electrode, the first electrode comprising a first conductive strip at least partially over a second conductive strip, the first strip of the first electrode including a wider portion having a first width and a narrower portion having a second width less than the first width, the wider portion of the first strip of the first electrode being electrically coupled to the second strip of the first electrode by one or more conductive vias; and a second capacitor electrode spacedly disposed from the first capacitor electrode, the second electrode comprising a first conductive strip at least partially over a second conductive strip, the first strip of the first electrode including a wider portion having a first width and a narrower portion having a second width less than the first width, the wider portion of the first strip of the first electrode being electrically coupled to the second strip of the first electrode by one or more conductive vias.

One or more embodiments relate to a semiconductor device, comprising: a capacitor structure, the capacitor structure comprising: a first capacitor electrode, the first electrode comprising at least one first capacitor plate, the first plate including at least a first conductive strip at least partially over a second conductive strip, the first strip of the first plate including a wider portion having a first width and a narrower portion having a second width less than the first width, the wider portion of the first strip of the first plate being electrically coupled to the second strip of the first plate by one or more conductive vias; and a second capacitor electrode spacedly disposed from the first capacitor electrode, the second electrode comprising at least one second capacitor plate, the second plate including at least a first conductive strip at least partially over a second conductive strip, the first strip of the second plate including a wider portion having a first width and a narrower portion having a second width less than the first width, the wider portion of the first strip of the second plate being electrically coupled to the second strip of the second plate by one or more conductive vias.

One or more embodiments relate to a capacitor structure, comprising: a plurality of substantially parallel capacitor plates, each of the plates including at least a first conductive strip at least partially over a second conductive strip, the first conductive strip of each of the plates including at least one wider portion having a first width and at least one narrower portion having a second width less than the first width, the wider portion of each of the first strips being electrically coupled to the second strip of the same plate by at least one conductive via, the capacitor plates being alternately electrically coupled together creating a first portion of plates and a second portion of plates, the first portion of plates forming a first electrode of the capacitor structure and the second portion of plates forming a second electrode of the capacitor structure.

BRIEF DESCRIPTION OF THE DRAWINGS

FIG. 6A shows a three dimensional view of a capacitor plate in accordance with the present invention;

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
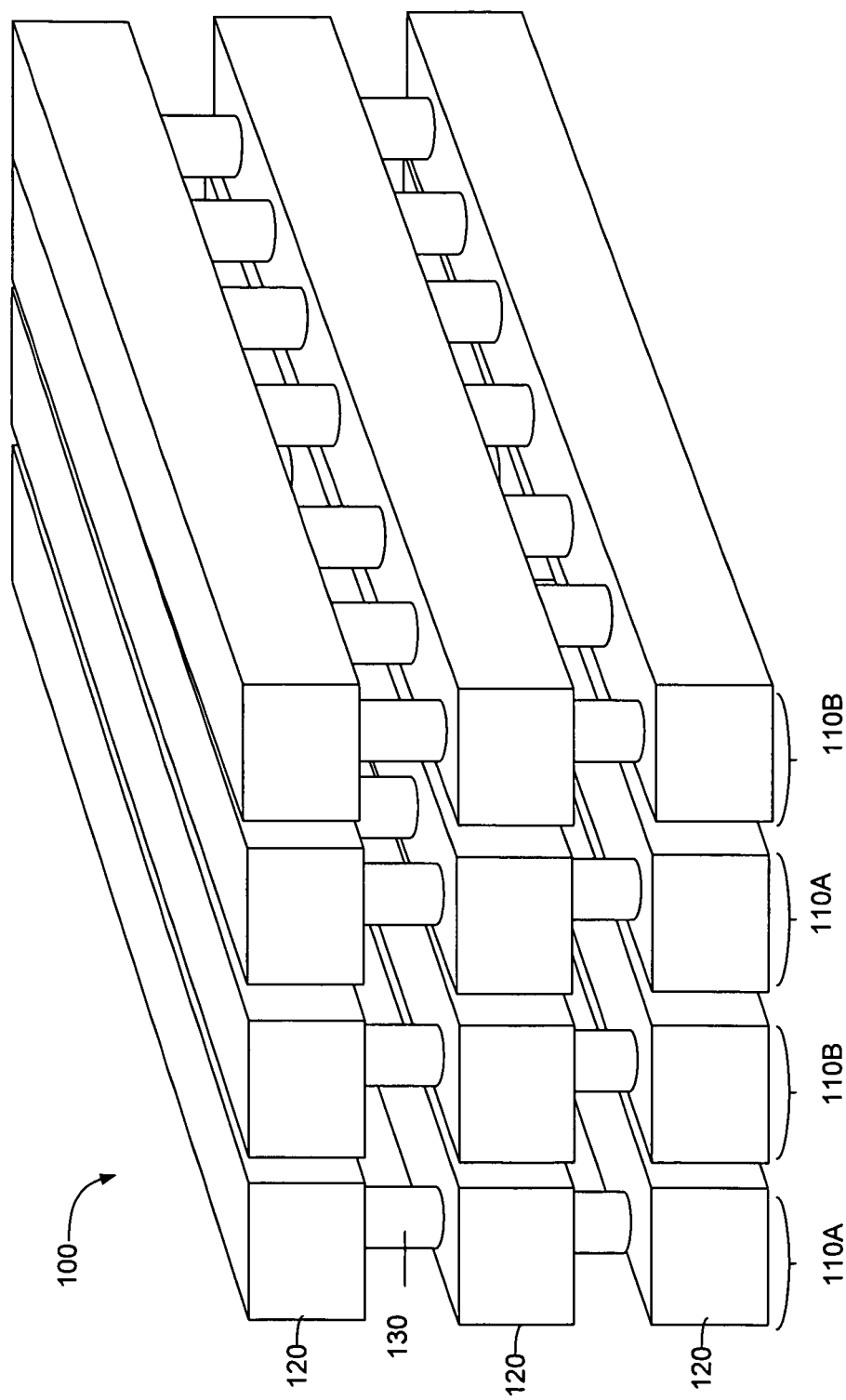
FIG. 1 shows a three dimension view of a capacitor structure.
Figure 2:
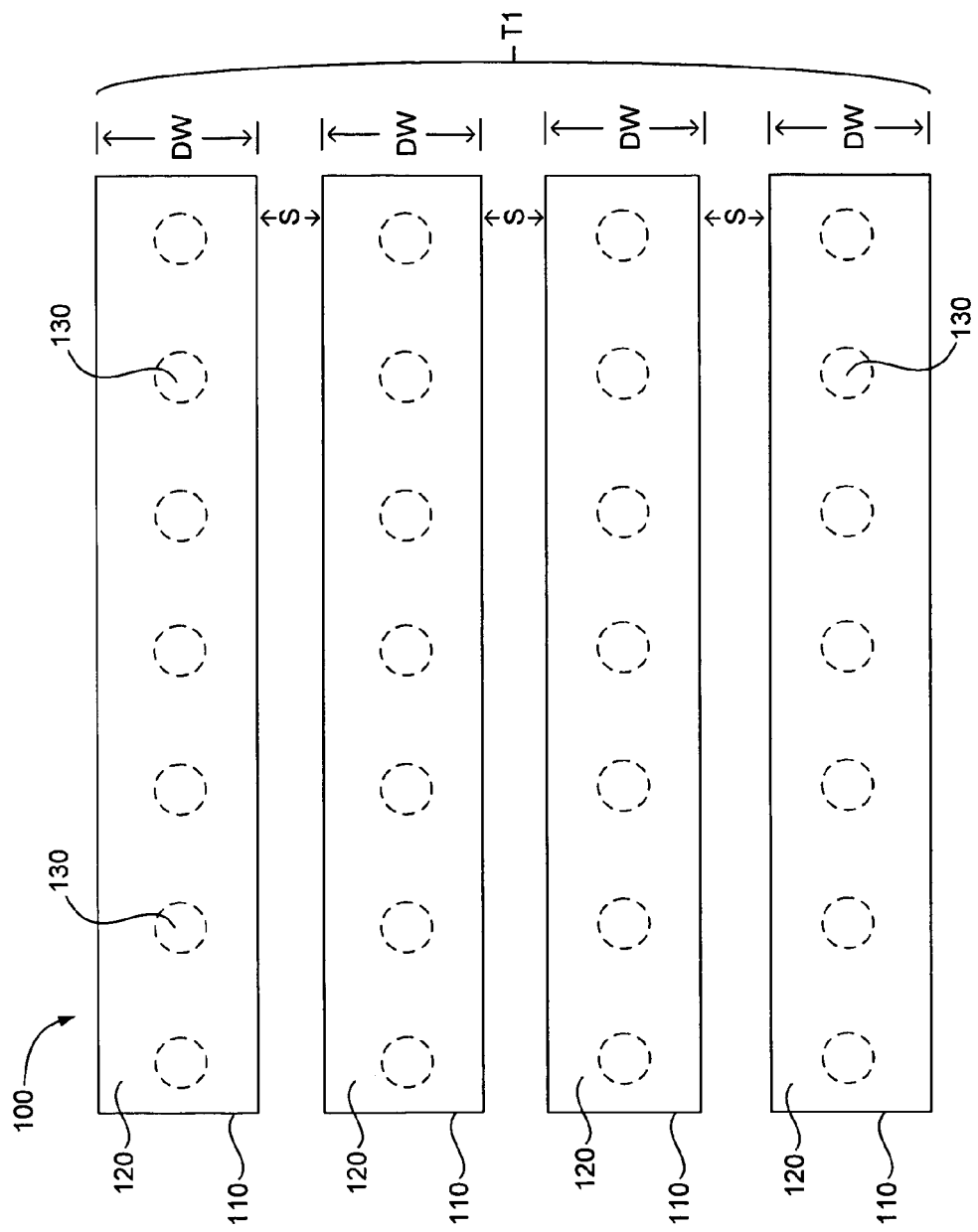
FIG. 2 shows a top view of the capacitor structure from FIG. 1.

FIG. 1 shows a three dimensional view of an example of a conventional capacitor structure that is referred to herein as a vertical parallel plate (VPP) capacitor structure 100. FIG. 2 shows a top view of the same capacitor structure 100 from FIG. 1. The VPP structure 100 comprises a plurality of capacitor plates 110A,B. Each of the capacitor plates 110A,B is substantially vertically disposed. The plates are 110A,B are substantially parallel to each other. Each plate is located a distance "S" from an adjacent plate. Each of the plates may be separated from the other plates by a dielectric.

In the example shown in FIGS. 1 and 2, each of the plates 110A,B comprises a plurality of conductive strips 120. However, more generally, each plate may comprise at least one conductive strip. Each conductive strip of a plate may be electrically coupled to an adjacent conductive strip of the same plate by one or more conductive vias 130. In the embodiment shown, the conductive strips of each of the plates are substantially parallel to each other. The capacitor plates 110A,B may be alternately electrically coupled together such that all of the first capacitor plates 110A are electrically coupled to each other to create a first capacitor electrode and all of the second capacitor plates 110B are electrically coupled to each other to form a second capacitor electrode.

Referring to the top view of structure 100 shown in FIG. 2, each of the plates 110A,B has a width DW. In addition, each of the plates is separated from an adjacent plate by a distance S. The total width T1 of the four plates shown is T1=(4)(DW)+(3)(S), where (A)(B) represents A multiplied by B.

Figure 3:
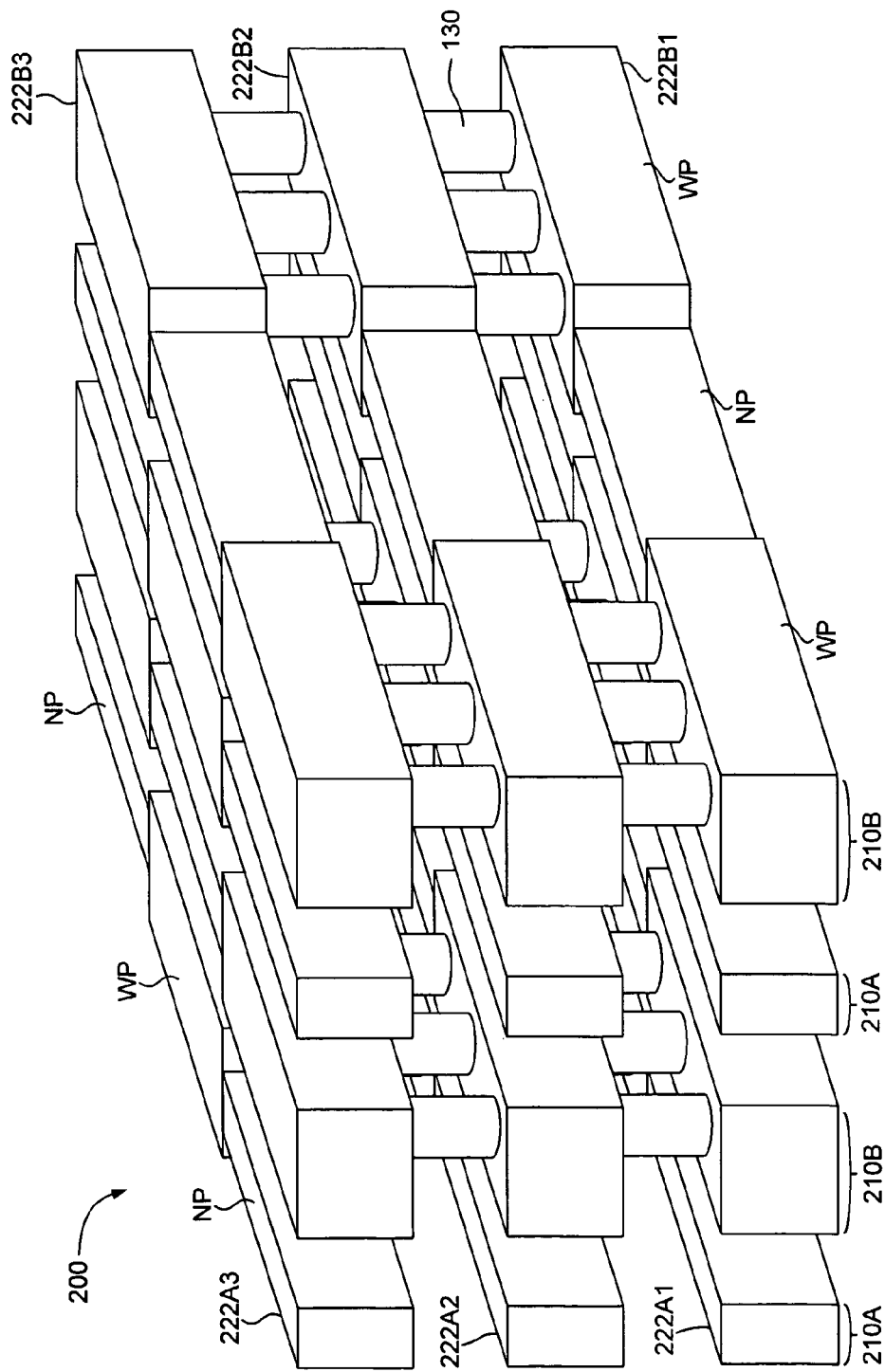
FIG. 3 shows a three dimensional view of a capacitor structure in accordance with an embodiment of the present invention.
Figure 4:
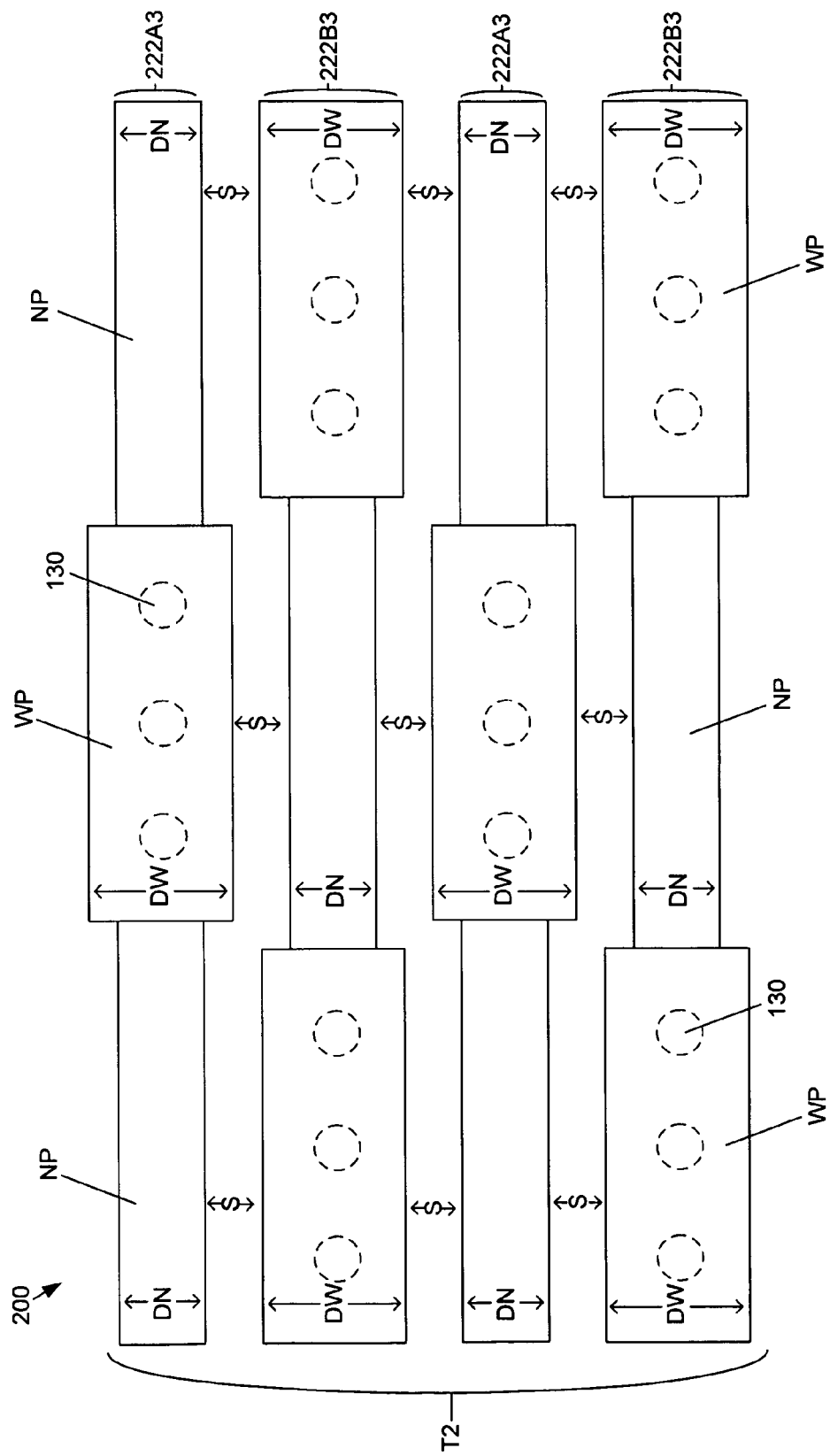
FIG. 4 shows a top view of the capacitor structure from FIG. 3.

FIG. 3 shows a three dimensional view of a capacitor structure 200 which is an embodiment of the present invention. FIG. 4 shows a top view of the same capacitor structure 200 from FIG. 3. The capacitor structure 200 comprises a plurality of capacitor plates 210A,B. The capacitor plates 210A,B include first capacitor plates 210A and second capacitor plates 210B. The first capacitor plates and the second capacitor plates are arranged in an alternating fashion such that a second capacitor plate 210B follows a first capacitor plate 210A and a first capacitor plate 210A follows a second capacitor plate 210B.

Generally, there can be one or more first capacitor plates. In an embodiment, there may be two or more first capacitor plates. Generally, there can be one or more second capacitor plates. In an embodiment, there may be two or more second capacitor plates.

In one or more embodiments, each of the capacitor plates 210A,B may be substantially vertically disposed. In one or more embodiments, all of the plates 210A,B may be substantially parallel to each other and located a distance "S" from an adjacent plate. In one or more embodiments, a plate 210A may face a plate 210B.

Each of the plates may be separated from an adjacent plate by a dielectric. Generally, any dielectric may be used. In one or more embodiments, the dielectric may include an oxide, a nitride, an oxynitride and combinations thereof. The dielectric may comprise a high-k material. The high-k material may have a dielectric constant greater than that of silicon dioxide. In one or more embodiments, the high-k material may have a dielectric constant greater that 3.9. In one or more embodiments, the dielectric may be a gas. In one or more embodiments, the dielectric may be air. In one or more embodiments, the dielectric may be a vacuum.

Figure 5A:
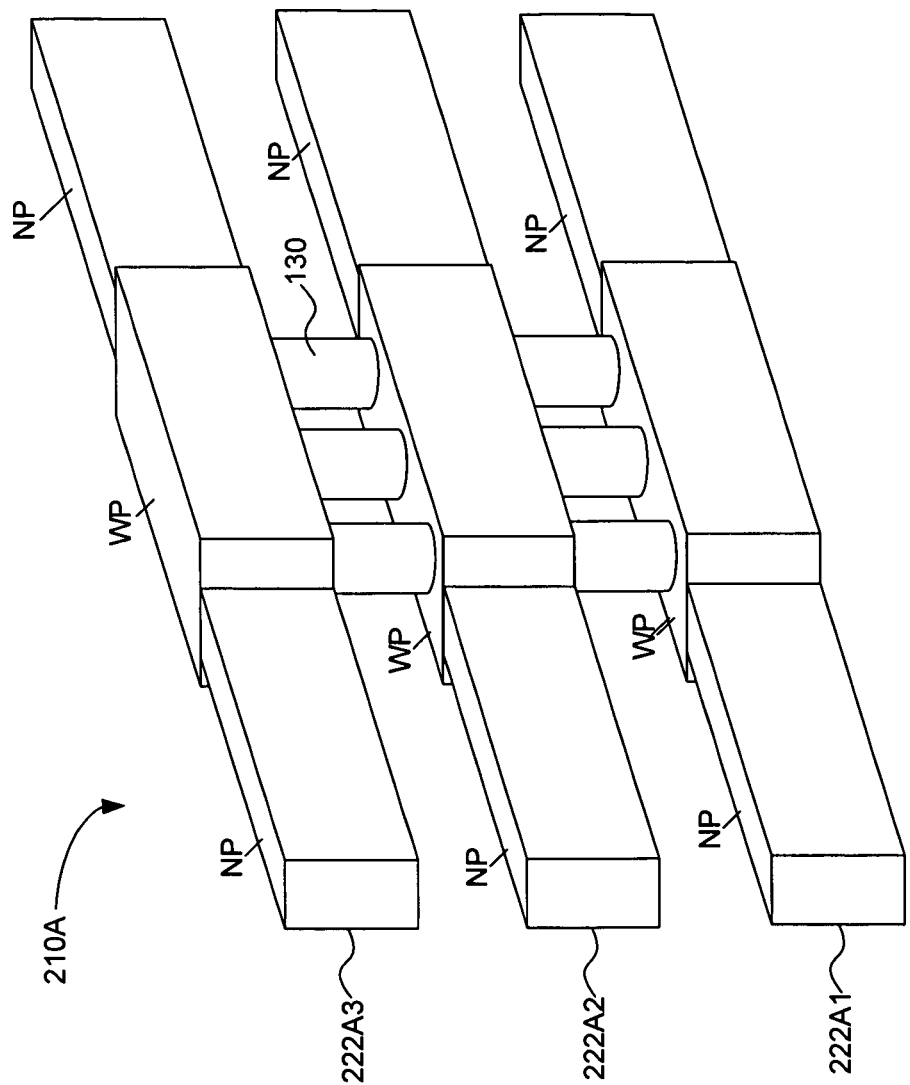
FIG. 5A shows a three dimensional view of a capacitor plate in accordance with an embodiment of the present invention.
Figure 5B:
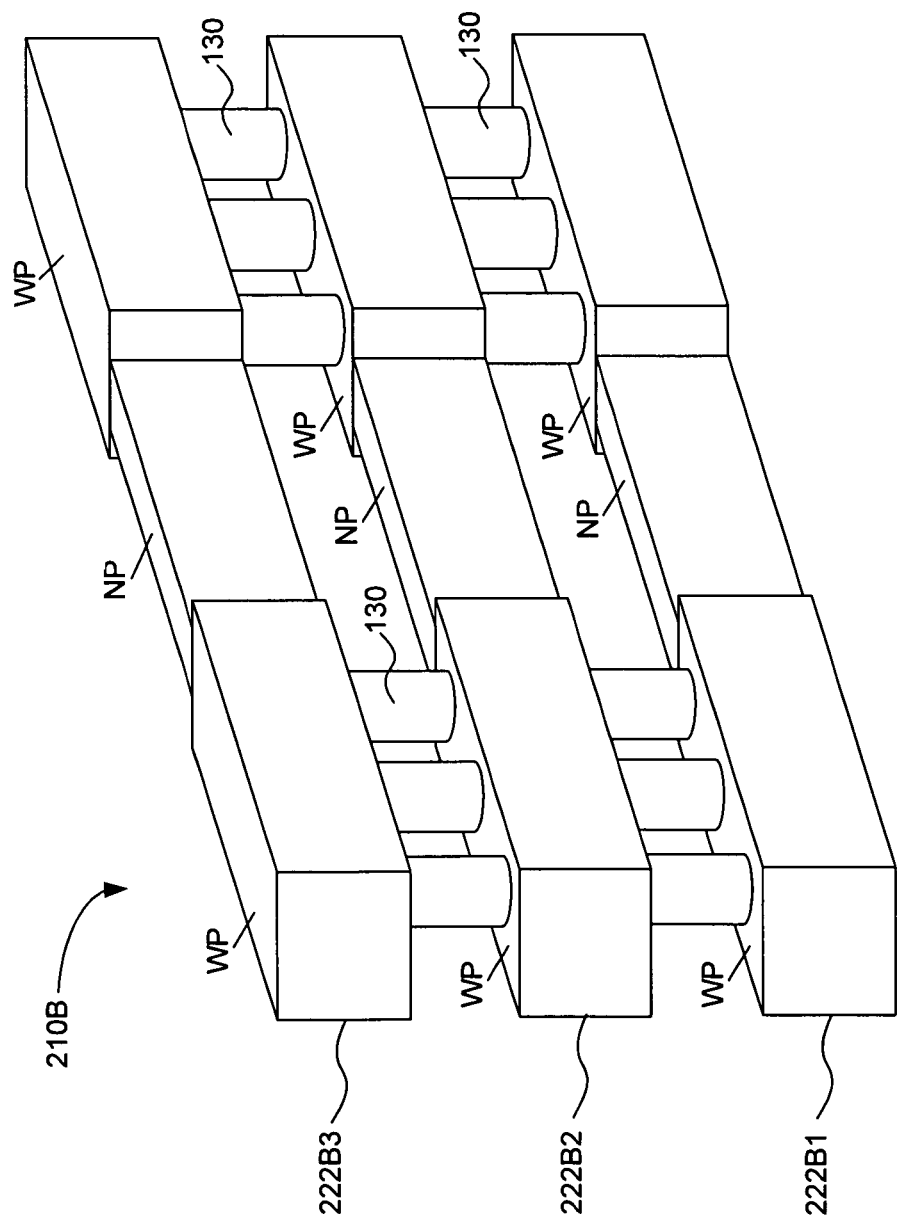
FIG. 5B shows a three dimensional view of a capacitor plate in accordance with an embodiment of the present invention.

FIG. 5A shows a three dimensional view of a first capacitor plate 210A while FIG. 5B shows a three dimensional view of a second capacitor plate 210B. First capacitor plate 210A comprises conductive strips 222A1, 222A2, 222A3 which may also be referred to as conductive strips 222A1,A2,A3. Likewise, each of the capacitor plates 220B comprises conductive strips 222B1, 222B2, 222B3 which may be referred to as strips 222B1,B2,B3. In one or more embodiments, the conductive strips of plate 210A may all be substantially parallel to each other. Likewise, in one or more embodiments, the conductive strips of plate 210B may all be substantially parallel to each other. In one or more embodiments, the conductive strips of the same plate may not be parallel to each other.

More generally, a first capacitor plate (such as capacitor plate 210A) may comprise one or more conductive strips. In one or more embodiments, a first capacitor plate may comprise two or more (i.e. a plurality of) conductive strips. Likewise, a second capacitor plate (such as capacitor plate 210B) may comprise one or more conductive strips. In one or more embodiments, each second capacitor plate may comprise two or more (i.e. a plurality of) conductive strips. The conductive strips of each plate may run substantially parallel to each other but this does not have to be the case.

In the embodiment shown in FIG. 5A, the conductive strips 222A1,A2,A3 may be arranged so that the center strip 222A2 is at least partially over the lower strip 222A1 and so that the upper strip 222A3 is at least partially over the center strip 222A2. Likewise, in the embodiment shown in FIG. 5B, the conductive strips 222B1,B2,B3 may be arranged so that the center strip 222B2 is at least partially over the lower strip 222B1, and the upper strip 222B3 is at least partially over the center strip 222B2.

In one or more embodiments, each of the conductive strips 222A1,A2,A3 of a plate 210A may be substantially horizontally disposed. In one or more embodiments, each of the conductive strips 222B1,B2,B3 of a plate 210B may be substantially horizontally disposed.

In an embodiment, the strips 222A1,A2,A3 may be disposed in an ascending arrangement. For example, strip 222A3 may be above strip 222A2 and strip 222A2 may be above strip 222A1. For example, strip 222A3 may be at a higher level than strip 222A2, and strip 222A2 may be at a higher level than strip 222A1. Each level may, for example, be a metallization level of the semiconductor device. In an embodiment, the ascending arrangement of conductive strips may be such that the plate 210A has a vertical component. For example, in one embodiment the plate 210A may be substantially vertically disposed. In another embodiment, the conductive strips may have a step-like arrangement so that the plate 210A has a vertical component but is tilted relative to the substrate.

In an embodiment, the strips 222B1,B2,B3 may be disposed in an ascending arrangement. For example, strip 222B3 may be above strip 222B2 and strip 222B2 may be above strip 222B1. For example, the strip 222B3 may be at a higher level than strip 222B2, and strip 222B2 may be at a higher level than strip 222B1. Each level may, for example, be a metallization level of the semiconductor device. In one or more embodiments, the strip 222B1 may be at about the same level as strip 222A1 (for example, both may be on the same metallization level). Likewise, the strip 222B2 may be on the same level as strip 222A2 (for example, both may be on the same metallization level). Likewise the strip 222B3 may be on the same level as strip 222A3 (both may be on the same metallization level).

In an embodiment, the ascending arrangement of conductive strips may be such that the plate 210B has a vertical component. For example, in one embodiment the plate 210B may be substantially vertically disposed. In another embodiment, the conductive strips may have a step-like arrangement so that the plate 210B has a vertical component but is tilted.

Each conductive strip of a capacitor plate may be electrically coupled to an adjacent conductive strip of the same capacitor plate. In one or more embodiments, this may be done by one or more conductive vias 130. In one or more embodiments, a plurality of conductive vias 130 may be used. In the embodiments of the first plates 210A and second plates 210B shown in FIGS. 5A and 5B, the conductive vias 130 have a circular cross section, however, more generally, the conductive vias may have any cross sectional shape including, but not limited to, circular, elliptical, square and rectangular. In addition, in one or more embodiments, the conductive vias may taper. For example, they may be wider at the top and narrower at the bottom.

Referring to FIG. 3, the capacitor plates 210A,B may be alternately electrically coupled together such that all of the first capacitor plates 210A are electrically coupled to each other to create a first capacitor electrode and all of the second capacitor plates 210B are electrically coupled to each other to form a second capacitor electrode.

The first capacitor electrode may be separated or spacedly disposed from the second capacitor electrode by a dielectric. Examples of possible dielectrics have been provided above. In one or more embodiments, the dielectric may be air. In one or more embodiments, the dielectric may be a vacuum.

Referring to the top view of structure 200 shown in FIG. 4 as well as the three dimensional view of first plate 210A shown in FIG. 5A, it is seen that each of the conductive strips 222A1,A2,A3 includes a wider portion WP having a first width DW and a narrower portion NP having a second width DN which is less than the first width DW. Generally, each of the conductive strips 222A1,A2,A3 may include at least one wider portion WP and at least one narrower portion NP. In one or more embodiments, each of the conductive strips 222A1, A2,A3 may include a plurality of wider portions WP. In one or more embodiments, each of the conductive strips 222A1,A2, A3 may include a plurality of narrower portions NP. In the embodiment shown, each of the conductive strips 222A1,A2, A3 includes a wider portion WP between two narrower portions NP. Other embodiments may include one or more additional wider portions, and may also include one or more additional narrower portions.

FIG. 4 shows a top view of the structure 200 from FIG. 3. Referring to the top view of structure 200 shown in FIG. 4 as well as the three dimensional view of second plate 210B shown in FIG. 5B, it is seen that each of the conductive strips 222B1,B2,B3 includes a wider portion WP having a first width DW and a narrower portion 224B having a second width DN which is less than the first width DW. Generally, each of the conductive strips 222B1,B2,B3 may include one or more wider portions WP. Generally, each of the conductive strips 222B1,B2,B3 may include one or more narrower portion NP. In one or more embodiments, each of the conductive strips 222B1,B2,B3 may include a plurality of wider portions WP. In one or more embodiments, each of the conductive strips 222B1,B2,B3 may include a plurality of narrower portions NP. In the embodiment shown in FIG. 5B, each of the conductive strips 222B1,B2,B3 includes a narrower portion NP between two wider portions WP. Other embodiments may include one or more additional narrower portions, and may also include one or more additional wider portions.

In one or more embodiments, the widths of each of wider portions of the same strip may be substantially uniform along the length of the strip. In one or more embodiments, the widths of each of the narrower portions of the same strip may be substantially uniform along the length of the strip. In one or more embodiments, each of the wider portions and each of the narrower portions may have the shape of a parallelepiped. In one or more embodiments, the parallelepiped may be a cuboid (six rectangular faces). In one or more embodiments, the cuboid may be a cube. Other shapes are also possible.

In one or more embodiments, the lengths of the wider portions WP may be the same as the lengths of the narrower portions. In one or more embodiments, the lengths of the wider portions WP may be different from the lengths of the narrower portions.

In one or more embodiments, the widths of all of the wider portions of the same conductive strip may be the same. In one or more embodiments, the lengths of all of the wider portions of the same conductive strip may be the same. In one or more embodiments, the widths of all of the narrower portions of the same conductive strip may be the same. In one or more embodiments, the lengths of all of the wider portions of the same conductive strip may be the same.

In one or more embodiments, the lengths of the wider portions may be the same as or may be different from the lengths of the narrower portions of the same conductive strip.

In one or more embodiments, the lengths of wider portions of a first plate may be the same as or may be different from the lengths of wider portions a second plate. In one or more embodiments, the lengths of narrower portions of a first plate may be the same as or may be different from the lengths of narrower portions a second plate.

Referring to FIGS. 5A and 5B, in one or more embodiments, the first width DW of wider portion WP of a conductive strip 222A1,2,3 may be the same as the first width DW of wider portion WP of a conductive strip 222B1,2,3. In other embodiments, it is possible that the two widths may be different. Likewise, in one or more embodiments, the second width DN of the narrower portion NP of a conductive strip 222A1,A2,A3 may be the same as the second width DN of the narrower portion NP of a conductive strip 222B1,B2,B3. However, this also does not have to the case and, in another embodiment, the two widths may be different.

Referring to FIG. 5A, the first plate 210A includes conductive vias 130. The wider portion WP of strip 222A3 may be electrically coupled to the wider portion of strip 222A2 by one or more (and possibly two or more) conductive vias 130. Likewise, the wider portion WP of strip 222A2 may be electrically coupled to the wider portion of strip 222A1 by one or more (and possibly two or more) conductive vias. The strips 222A1,A2,A3 may include one or more additional wider portions WP and well as one or more additional narrower portions NP.

Referring to FIG. 5B, the second plate 210B also includes conductive vias 130. Each of the wider portions of the strip 222B3 may be electrically coupled to the strip 222B2 by one or more (and possible two or more) conductive vias. In the embodiment shown, each wider portion WP of strip 222B3 may be electrically coupled to a corresponding wider portion WP of strip 222B2 by one or more (and possibly two or more) conductive vias. Likewise, the wider portions WP of the strip 222B2 may be electrically coupled to the wider portions WP of strip 222B1 by one or more (and possibly two or more) conductive vias 130. The strips 222B1,B2,B3 may include one or more additional narrower portions NP as well as one or more additional wider portions WP.

Referring to the three-dimensional view of structure 200 shown in FIG. 3 as well as the top view shown in FIG. 4, it is seen that the first plates 210A may be arranged with respect to the second plates 210B such that the wider portions WP of the first plates 220A may be opposite the narrower portions NP of the second plates 220B. Likewise, it is seen that the narrower portions NP of the first plates 210A may be opposite the wider portions WP of the second plates 210B.

The first plates 210A may all be electrically coupled together to form a first capacitor electrode of a capacitor. Likewise, all of the second plates 210B may be electrically coupled together to form a second capacitor electrode of the same capacitor. The first and second capacitor electrodes may be spacedly disposed from each other. In one or more embodiments, the capacitor structure formed may be a parallel plate capacitor.

Referring to FIG. 4, it is seen that the distance between a first plate 210A and a second plate 210B may be a distance S which may be the same as the distance between the plates 110A,B shown in FIG. 1 and FIG. 2. However, the total width of the structure 200 shown in FIG. 3 and FIG. 4 is T2 which may be less than the total width T1 of the structure 100 shown in FIG. 1 and FIG. 2. Hence, it is possible that the same capacitance may be achieved with a smaller total width.

Referring to FIG. 4 and FIGS. 5A,5B, in one or more embodiments, it is possible that upper conductive strips may be electrically coupled to lower conductive strips using one or more conductive vias. It has been noted that the conductive vias 130 may taper so that they are wider at the top and narrower at the bottom. The maximum width (or diameter) of the conductive via may be denoted at Dvia. In one or more embodiments, the width DN of the narrower portion NP of the conductive strips may be chosen to be less than the maximum width Dvia of the conductive via 130.

Figure 5C:
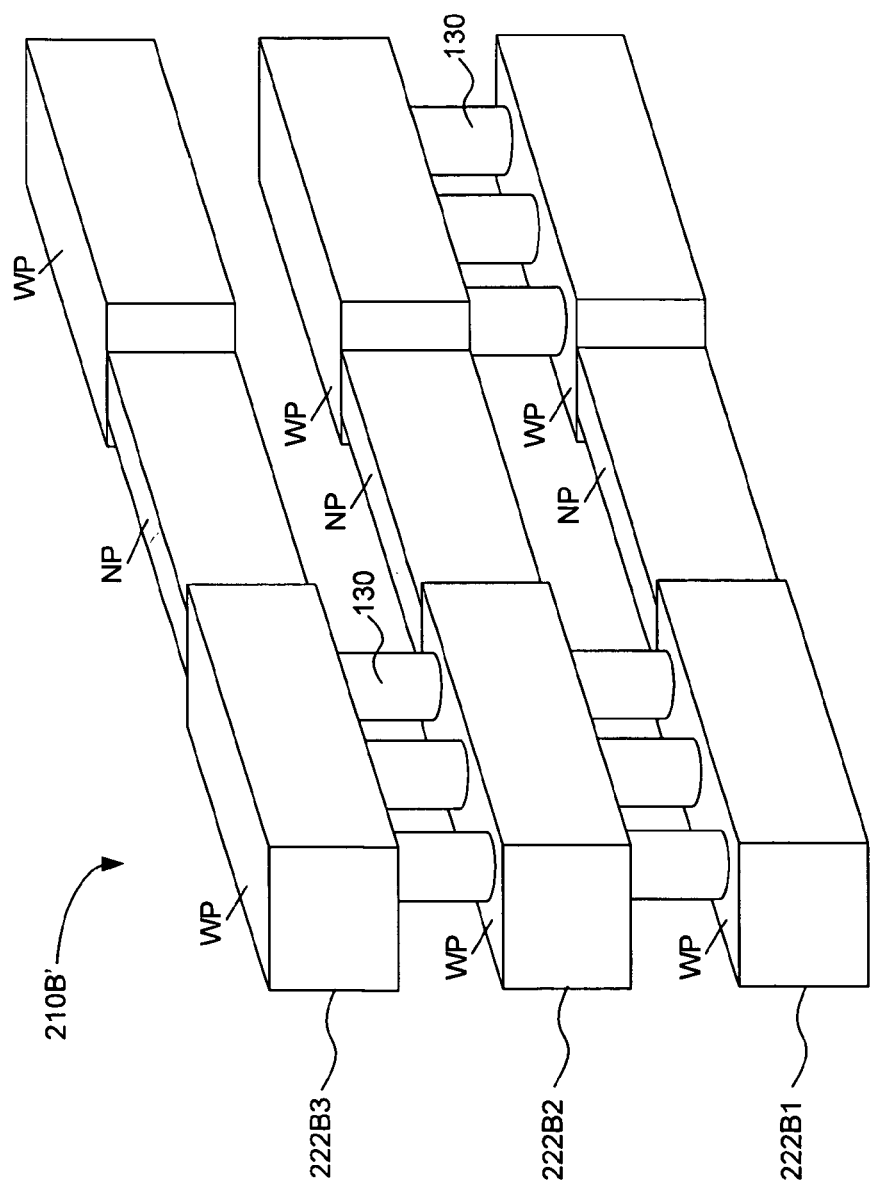
FIG. 5C shows a three dimensional view of a capacitor plate in accordance with an embodiment of the present invention.

FIG. 5C shows a second capacitor plate 210B' which is also an embodiment of the present invention. The plate 210B' is a variation of the plate 210B shown in FIG. 5B. For the plate 210B' there are no conductive vias electrically coupled between one of the wider portions WP of the strip 322B3 and the strip 322B2.

Figure 6B:
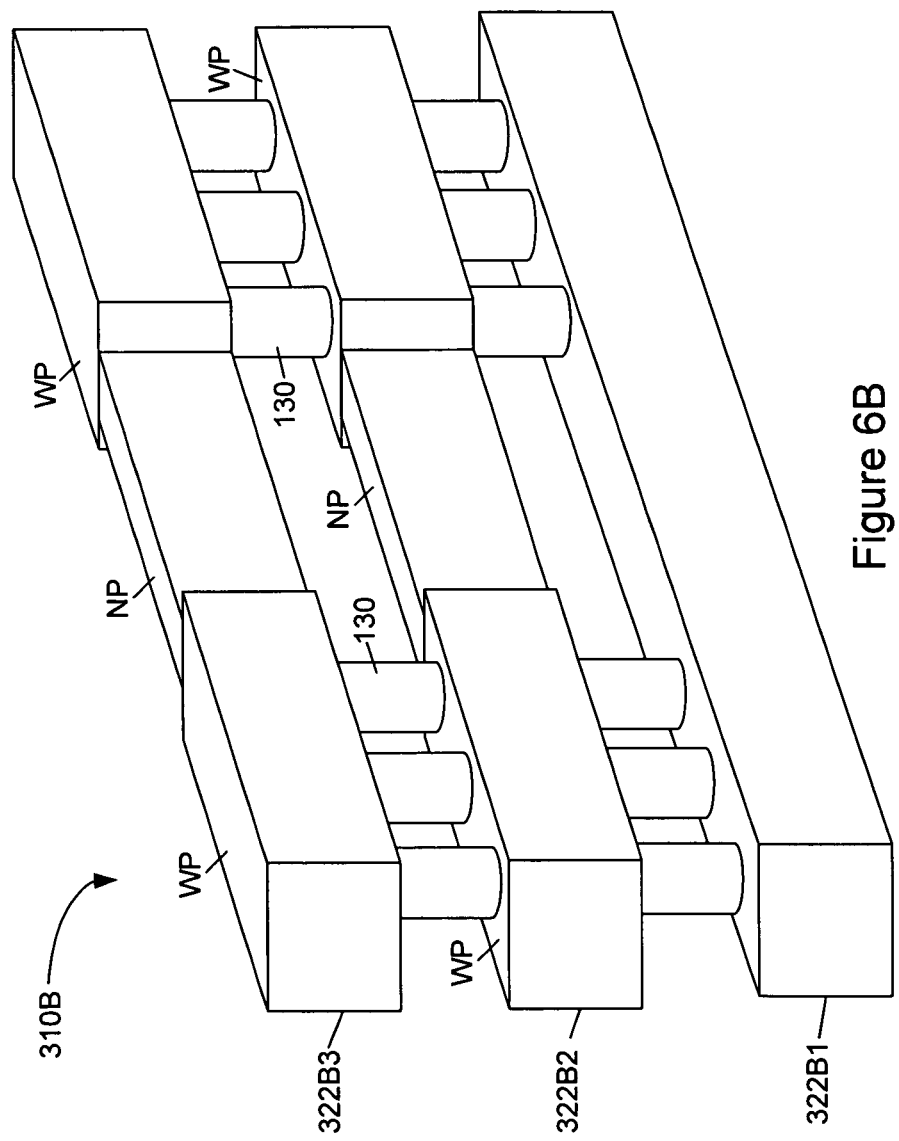
FIG. 6B shows a three dimensional view of a capacitor plate in accordance with an embodiment the present invention.

FIGS. 6A, 6B shows first and second capacitor plates 310A, 310B which are another embodiment of the invention. FIG. 6A shows a first plate 310A comprising a conductive strip 322A3 at least partially over a conductive strip 322A2. The conductive strip 322A2 is at least partially over the conductive strip 322A1.

The conductive strip 322A3 has at least one wider portion WP and at least one narrower portion NP with a width less than that of the wider portion WP. The conductive strip 322A2 also has at least one wider portion WP and at least one narrower portion NP. Each wider portion WP may have a width DW. Each narrower portion NP may have a width DN. In one or more embodiments, the conductive strip 322A1 may have a substantially uniform width DB. In an embodiment, the width DB may be less than the width DW and greater than the width DN. As an example, the width DB may be about (DW+DN)/2.

A first plate 310A may have one or more conductive strips (such as strips 322A2 or 322A3) above a conductive strip 322A1. Each conductive strip 322A2,A3 may include at least one wider portion WP and at least one narrower portion NP. In one or more embodiments, the conductive strips 322A3,A2 may include additional wider portions and additional narrower portions.

One or more conductive vias may be coupled between a wider portion WP of strip 322A3 and a wider portion of strip 322A2. One or more conductive vias 130 may be coupled between a wider portion WP of conductive strip 322A2 and a conductive strip 322A1 which may have a substantially uniform width.

In one or more embodiments, each of the conductive strips 322A1,A2,A3 of a plate 310A may be substantially horizontally disposed. In an embodiment, the strips 322A1,A2,A3 may be disposed in an ascending arrangement. For example, strip 322A2 may be above strip 322A1 and strip 322A3 may be above strip 322A2. For example, each strip may be formed as part of a higher metallization level. In an embodiment, the ascending arrangement of conductive strips may be such that the plate 310A has a vertical component. For example, in one embodiment the plate 310A may be substantially vertically disposed. In another embodiment, the conductive strips may have a step-like arrangement so that the plate 310A has a vertical component but is tilted.

FIG. 6B shows a second plate 310B comprising a conductive strip 322B2 at least partially over a conductive strip 322B1 and a conductive strip 322B3 at least partially over a conductive strip 322B2. The conductive strip 322B3 has at least one wider portion WP and at least one narrower portion NP having a width less than the wider portion WP. In one or more embodiments, the conductive strip 322B3 may have at least two wider portions WP. In one or more embodiments, the conductive strip 322B3 may have at least two narrower portions NP. The conductive strip 322B2 also has at least one wider portion WP and at least one narrower portion NP. In one or more embodiments, the strip 322B2 may have at least two wider portions WP. In one or more embodiments, the conductive strip 322B2 may have at least two narrower portions NP.

Each wider portion WP may have a width DW. Each narrower portion NP may have a width DN. In one or more embodiments, the conductive strip 322B1 may have a substantially uniform width DB. In an embodiment, the width DB may be less than the width DW and greater than the width DN. As an example, the width DB may be about (DW+DN)/2.

The second plate 310B may have one or more conductive strips such as 322B2 or 322B3 above the conductive strip 322B1. Each conductive strip 322B2,B3 may include at least one wider portion WP and at least one narrower portion NP. The conductive plate 310B illustrates that a conductive via 130 may be electrically coupled between the wider portion NP of a conductive strip 322B2 and a conductive strip 322B1 which may have a substantially uniform width.

In one or more embodiments, each of the conductive strips 322B1,B2,B3 of a plate 310A may be substantially horizontally disposed. In an embodiment, the strips 322B1,B2,B3 may be disposed in an ascending arrangement. For example, strip 322B3 may be above strip 322B2 and strip 322B2 may be above strip 322B1. In an embodiment, the ascending arrangement of conductive strips may be such that the plate 310B has a vertical component. For example, in one embodiment the plate 310B may be substantially vertically disposed.

In another embodiment, the conductive strips may have a step-like arrangement so that the plate 310B has a vertical component but is tilted.

Referring to FIGS. 6A, 6B, in one or more embodiments, it is possible that a conductive strip 322A2 may be electrically coupled to a conductive strip 322A1 using one or more conductive vias 130. It is noted that the conductive vias 130 may taper so that they are wider at the top and narrower at the bottom. The maximum width (or diameter) of the conductive via may be denoted at Dvia. In one or more embodiments, the width DB of the conductive strip 322A1 may be chosen to be less than the maximum width Dvia of the conductive via 130.

In one or more embodiments, the conductive strips 322A1, 322B1 may be part of a first metallization level. Likewise, the conductive strips 322A2, 322B2 may be part of a second metallization level above (e.g. at a higher level) as the first metallization level. Likewise, the conductive strips 322A3, 322B3 may be part of a third metallization level above (e.g. at a high level) as the second metallization level.

Figure 7A:
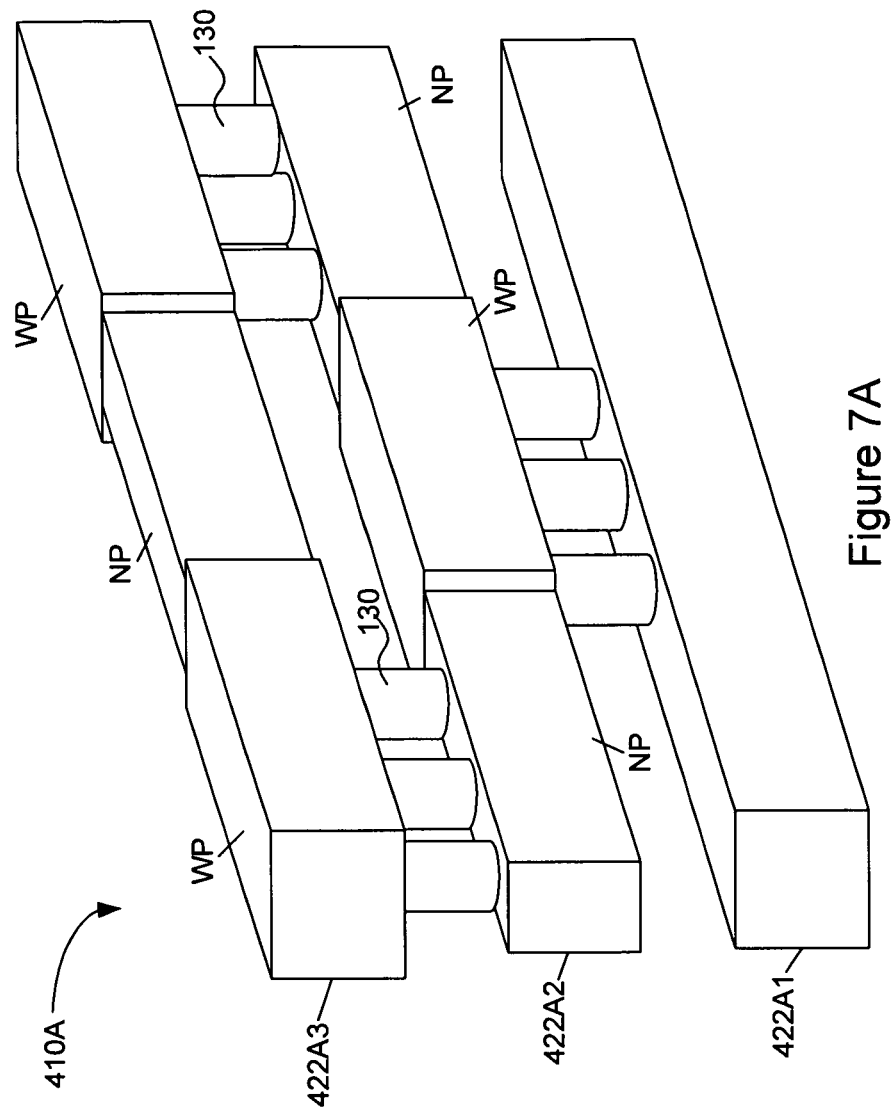
FIG. 7A shows a three dimensional view of a capacitor plate in accordance with an embodiment of the present invention.
Figure 7B:
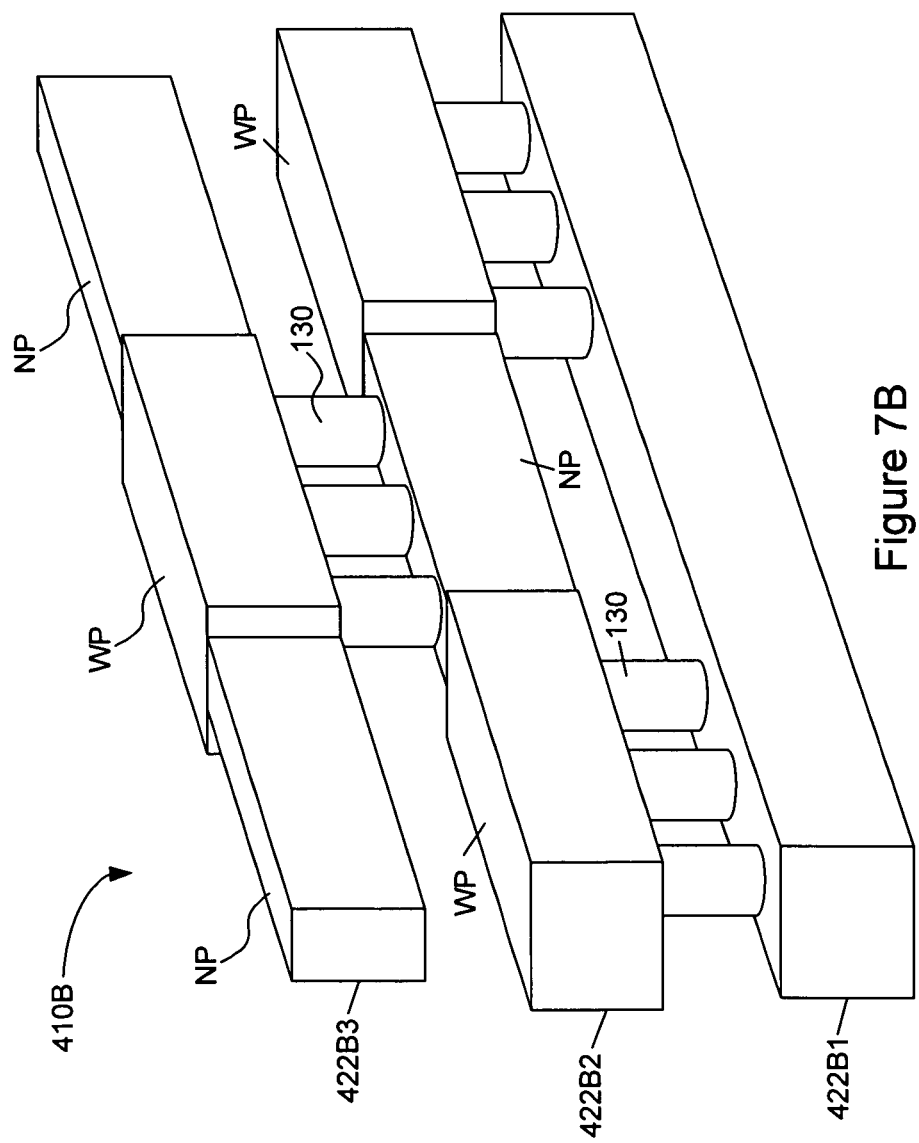
FIG. 7B shows a three dimensional view of a capacitor plate in accordance with an embodiment of the present invention.
Figure 8A:
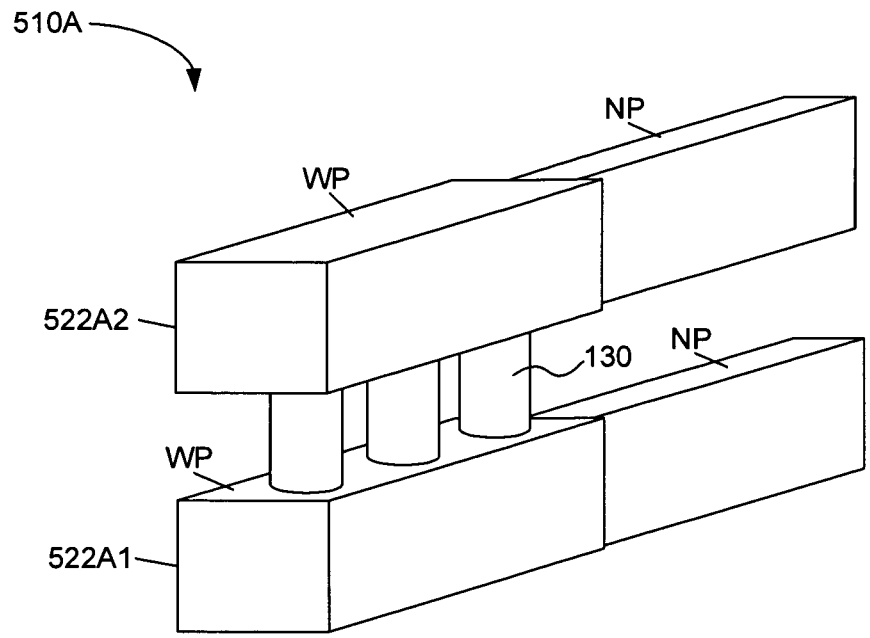
FIG. 8A shows a three dimensional view of a capacitor plate in accordance with an embodiment of the present invention.
Figure 8B:
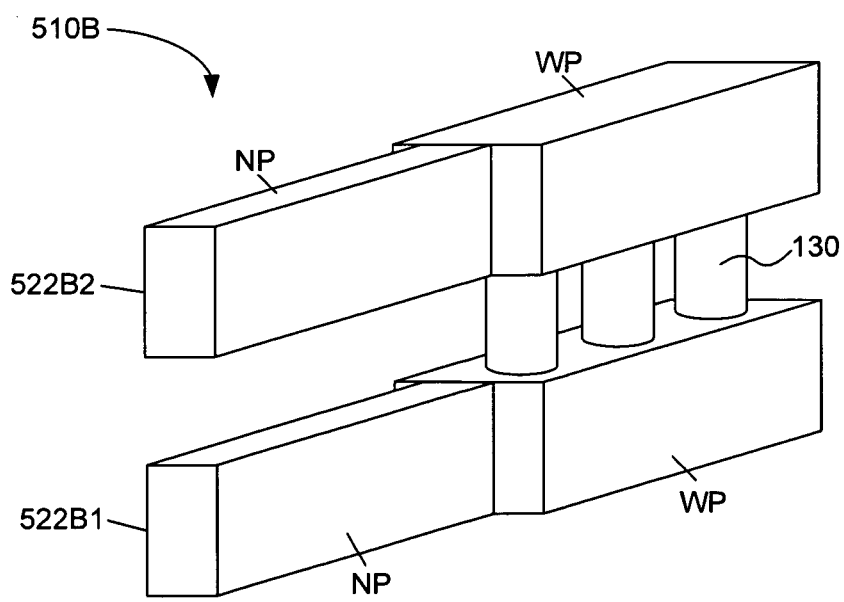
FIG. 8B shows a three dimensional view of a capacitor plate in accordance with an embodiment of the present invention.

FIGS. 7A, 7B shows first and second capacitor plates 410A, 410B which are another embodiment of the present invention. The first plate 410A comprises a conductive strip 422A2 at least partially over a conductive strip 422A1 and a conductive strip 422A3 at least partially over a conductive strip 422A2. The conductive strip 422A1 may have a substantially uniform width. The strip 422A2 includes at least one wider portion WP and at least one narrower portion NP having a width less than that of the wider portion WP. The conductive strip 422A3 includes at least one wider portion WP and at least one narrower portion NP having a width less than that of the wider portion NP.

FIG. 7A illustrates that a wider portion WP of a conductive strip 422A3 may be electrically coupled to narrower portion NP of conductive strip 422A2 using one or more conductive vias. FIG. 7A also illustrates that a wider portion WP of conductive strip 422A2 may be electrically coupled to a conductive strip 422A1 using one or more conductive vias.

The second plate 410B comprises a conductive strip 422B2 at least partially over a conductive strip 422B1 and a conductive strip 422B3 at least partially over a conductive strip 422B2. The conductive strip 422B1 may have a substantially uniform width. The strip 422B2 includes at least one wider portion WP and at least one narrower portion NP having a width less than that of the wider portion WP. The conductive strip 422B3 includes at least one wider portion WP and at least one narrower portion NP having a width less than that of the wider portion NP.

FIG. 7B illustrates that a wider portion WP of a conductive strip 422B3 may be electrically coupled to narrower portion NP of conductive strip 422B2 using one or more conductive vias. FIG. 7B also illustrates that a wider portion WP of conductive strip 422B2 may be electrically coupled to a conductive strip 422B1 using one or more conductive vias.

In one or more embodiments, each of the conductive strips 422A1, A2, A3 of a plate 410A may be substantially horizontally disposed. In an embodiment, the strips 422A1, A2, A3 may be disposed in an ascending arrangement. Strip 422A3 may be above strip 422A2 and strip 422A2 may be above strip 422A1. In an embodiment, the ascending arrangement of conductive strips may be such that the plate 410A has a vertical component. For example, in one embodiment the plate 410A may be substantially vertically disposed. In another embodiment, the conductive strips may have a step-like arrangement so that the plate 410A has a vertical component but is tilted.

In one or more embodiments, each of the conductive strips 422B1, B2, B3 of a plate 410B may be substantially horizontally disposed. In an embodiment, the strips 422B1, B2, B3 may be arranged above each other in an ascending arrangement. In an embodiment, the ascending arrangement of conductive strips may be such that the plate 410B has a vertical component. For example, in one embodiment the plate 410B may be substantially vertically disposed. In another embodiment, the conductive strips may have a step-like arrangement so that the plate 410B has a vertical component but is tilted.

In one or more embodiments, the conductive strips 422A1, 422B1 may be part of a first metallization level. Likewise, the conductive strips 422A2, 422B2 may be part of a second metallization level above (e.g. at a higher level as) the first metallization level. Likewise, the conductive strips 422A3, 422B3 may be part of a third metallization level above (e.g. at a high level as) the second metallization level.

Additional embodiments for the first and second capacitor plates are shown in FIGS. 8 through 11. Another embodiment is shown in FIGS. 8A and 8B. FIGS. 8A, 8B show a first capacitor plate 510A and a second capacitor plate 510B, respectively. The first capacitor plate 510A comprises an upper conductive strip 522A2 at least partially over a lower conductive strip 522A1. Each conductive strip comprises at least one wider portion WP and at least one narrower portion NP. In the embodiment shown in FIG. 8A, the wider portion NP of the upper conductive strip 522A2 is electrically coupled to the wider portion WP of the lower conductive strip 522A1 by one or more conductive vias 130. In one or more embodiments, there may be no conductive vias coupled between a narrower portion NP of upper strip 522A2 and narrower portion NP of lower strip 522A1.

The second capacitor plate 510B comprises an upper conductive strip 522B2 at least partially over a lower conductive strip 522B1. Each conductive strip comprises a wider portion WP and a narrower portion NP. In the embodiment shown in FIG. 8B, the wider portion WP of the upper conductive strip 522B2 is electrically coupled to the wider portion WP of the lower conductive strip 522B1 by one or more conductive vias 510B. In one or more embodiments, there may be no conductive vias 130 coupled between the narrower portion NP of the upper strip 522B2 and the narrower portion NP of the lower strip 522B1.

In one or more embodiments, each of the conductive strips 522A1, A2 of a plate 510A may be substantially horizontally disposed. In an embodiment, the strip 522A2 may be above the strip 522A1 in an ascending arrangement. In an embodiment, the ascending arrangement of conductive strips may be such that the plate 510A has a vertical component. For example, in one embodiment the plate 510A may be substantially vertically disposed. In another embodiment, the conductive strips may have a step-like arrangement so that the plate 510A has a vertical component but is tilted.

In one or more embodiments, each of the conductive strips 522B1, B2 of a plate 510B may be substantially horizontally disposed. In an embodiment, the strips 522B1, B2 may be arranged above each other in an ascending arrangement. In an embodiment, the ascending arrangement of conductive strips may be such that the plate 510B has a vertical component. For example, in one embodiment the plate 510B may be substantially vertically disposed. In another embodiment, the conductive strips may have a step-like arrangement so that the plate 510B has a vertical component but is tilted.

In one or more embodiments, the conductive strips 522A1, 522B1 may be part of a first metallization level. Likewise, the conductive strips 522A2, 522B2 may be part of a second metallization level above (e.g. at a higher level as) the first metallization level.

Figure 9A:
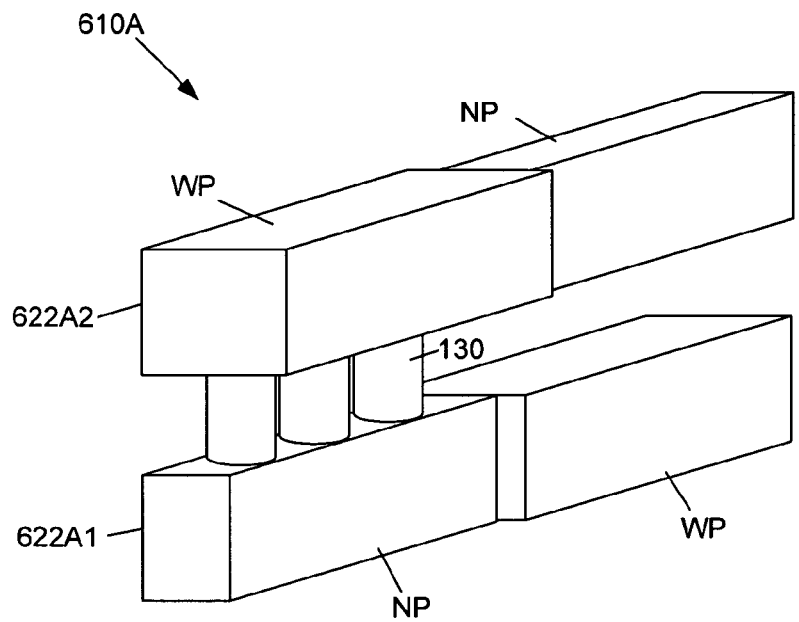
FIG. 9A shows a three dimensional view of a capacitor plate in accordance with an embodiment of the present invention.
Figure 9B:
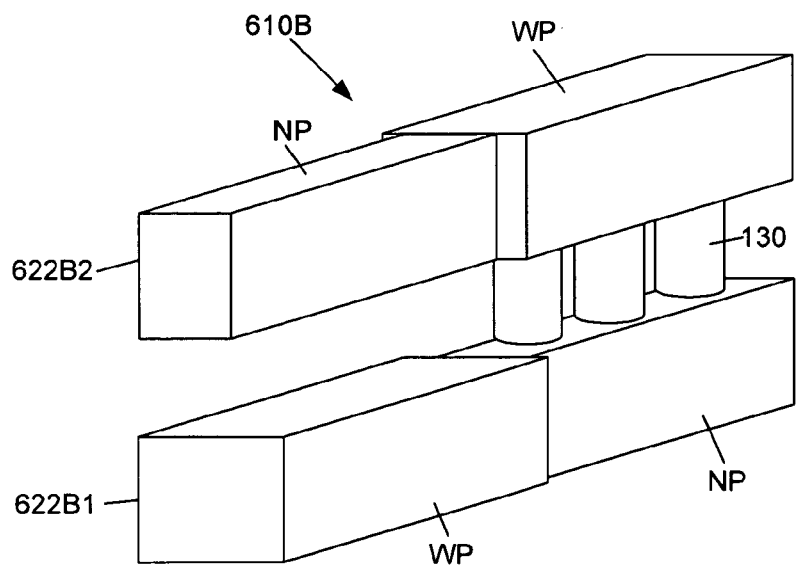
FIG. 9B shows a three dimensional view of a capacitor plate in accordance with an embodiment of the present invention.

Another embodiment is shown in FIGS. 9A and 9B. FIGS. 9A, 9B shows a first capacitor plate 610A and a second capacitor plate 610B, respectively. The first conductive plate 610A comprises an upper conductive strip 622A2 at least partially over a lower conductive strip 622A1 so that the upper conductive strip 622A2 is at least partially over the lower conductive strip 622A1. Each conductive strip comprises at least one wider portion WP and at least one narrower portion NP. In the embodiment shown in FIG. 9A, the wider portion WP of the upper conductive strip 622A2 is electrically coupled to the narrower portion NP of the lower conductive strip 622A2 using or more conductive vias 130. In one or more embodiments, there may not be any conductive vias coupled between the narrower portion NP of the upper strip 622A2 and the lower strip 622A1.

The second capacitor plate 610B comprises an upper conductive strip 622B2 at least partially over a lower conductive strip 622B1. Each conductive strip comprises at least one wider portion WP and at least one narrower portion NP having a width less than the wider portion. In the embodiment shown in FIG. 9B, the wider portion WP of the upper conductive strip 622B2 is electrically coupled to the narrower portion NP of the lower conductive strip 622B1 using one or more conductive vias 130. In one or more embodiments, there may not be any conductive vias coupled between the narrower portion NP of the upper strip 622B2 and the lower strip 622B1.

In one or more embodiments, each of the conductive strips 622A1,A2 of a plate 610A may be substantially horizontally disposed. In an embodiment, the strip 622A2 may be above the strip 622A1 in an ascending arrangement. In an embodiment, the ascending arrangement of conductive strips may be such that the plate 610A has a vertical component. For example, in one embodiment the plate 610A may be substantially vertically disposed. In another embodiment, the conductive strips may have a step-like arrangement so that the plate 610A has a vertical component but is tilted.

In one or more embodiments, each of the conductive strips 622B1,B2 of a plate 610B may be substantially horizontally disposed. In an embodiment, the strip 622B2 may be above the strip 622B1 in an ascending arrangement. In an embodiment, the ascending arrangement of conductive strips may be such that the plate 610B has a vertical component. For example, in one embodiment the plate 610B may be substantially vertically disposed. In another embodiment, the conductive strips may have a step-like arrangement so that the plate 610B has a vertical component but is tilted.

In one or more embodiments, the conductive strips 622A1, 622B1 may be part of a first metallization level. Likewise, the conductive strips 622A2, 622B2 may be part of a second metallization level above (e.g. at a higher level as) the first metallization level.

Figure 10A:
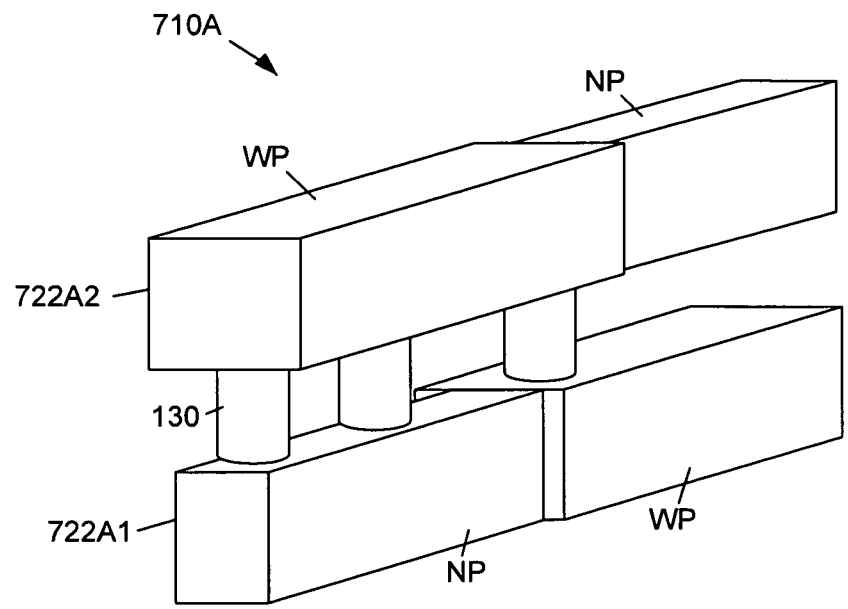
FIG. 10A shows a three dimensional view of a capacitor plate in accordance with an embodiment of the present invention.
Figure 10B:
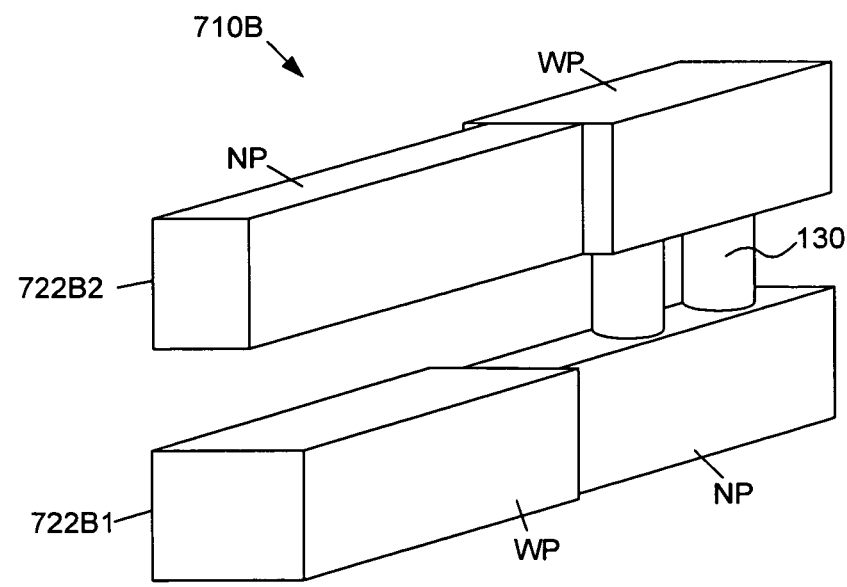
FIG. 10B shows a three dimensional view of a capacitor plate in accordance with an embodiment of the present invention.

Another embodiment is shown in FIGS. 10A and 10B. FIGS. 10A, 10B show a first capacitor plate 710A and a second capacitor plate 710B, respectively. The first conductive plate 710A comprises an upper conductive strip 722A2 disposed at least partially over a lower conductive strip 722A1. The upper conductive strip 722A2 includes at least one wider portion WP and at least one narrower portion NP. The lower conductive strip 722A1 includes at least one wider portion WP and at least one narrower portion NP. The wider portion WP of the upper conductive strip 722A2 is electrically coupled to the narrower portion NP of the lower conductive strip 722A1 by one or more conductive vias 130. The wider portion WP of the upper conductive strip 722A2 is electrically coupled to the wider portion WP of the lower conductive strip 722A1 by one or more conductive vias 130. FIG. 10A illustrate that the wider portion of an upper conductive strip may be electrically coupled to both the wider and narrower portions of a lower conductive strip. In one or more embodiments, there may be no conductive vias coupled between the narrower portion NP of the upper strip 722A2 and the lower strip 722A1.

The second conductive plate 710B comprises an upper conductive strip 722B2 disposed at least partially over a lower conductive strip 722B1. The upper conductive strip 722B2 includes at least one wider portion WP and at least one narrower portion NP. The lower conductive strip 722B1 includes at least one wider portion WP and at least one narrower portion NP. The wider portion WP of the upper conductive strip 722B2 is electrically coupled to the narrower portion NP of the lower conductive strip 722B1 by one or more conductive vias 130. In one or more embodiments, there may not be any conductive vias coupled between the narrower portion NP of the upper strip 722B2 and the lower strip 722B1.

In one or more embodiments, each of the conductive strips 722A1,A2 of a plate 710A may be substantially horizontally disposed. In an embodiment, the strip 722A2 may be above the strip 722A1 in an ascending arrangement. In an embodiment, the ascending arrangement of conductive strips may be such that the plate 710A has a vertical component. For example, in one embodiment the plate 710A may be substantially vertically disposed. In another embodiment, the conductive strips may have a step-like arrangement so that the plate 710A has a vertical component but is tilted.

In one or more embodiments, each of the conductive strips 722B1,B2 of a plate 710B may be substantially horizontally disposed. In an embodiment, the strip 722B2 may be above the strip 722B1 in an ascending arrangement. In an embodiment, the ascending arrangement of conductive strips may be such that the plate 710B has a vertical component. For example, in one embodiment the plate 710B may be substantially vertically disposed. In another embodiment, the conductive strips may have a step-like arrangement so that the plate 710B has a vertical component but is tilted.

In one or more embodiments, the conductive strips 722A1, 722B1 may be part of a first metallization level. Likewise, the conductive strips 722A2, 722B2 may be part of a second metallization level above (e.g. at a higher level as) the first metallization level.

Figure 11A:
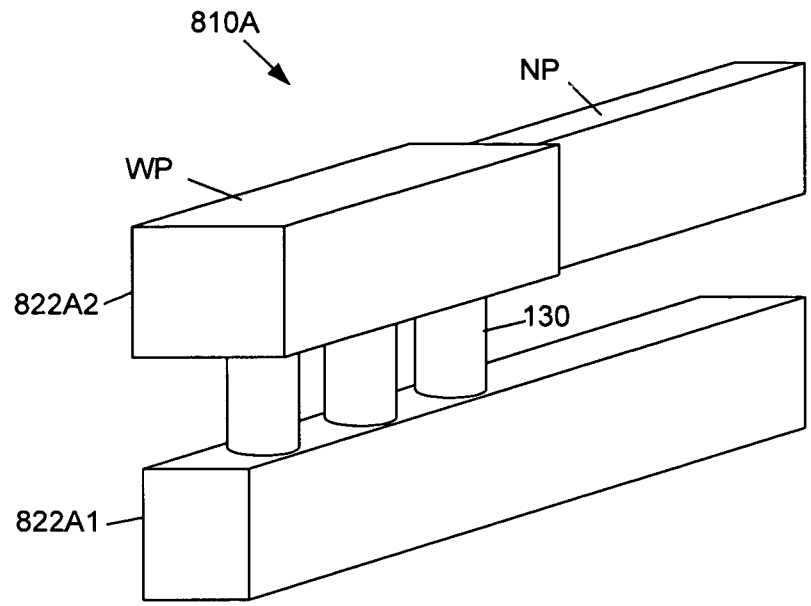
FIG. 11A shows a three dimensional view of a capacitor plate in accordance with an embodiment of the present invention.
Figure 11B:
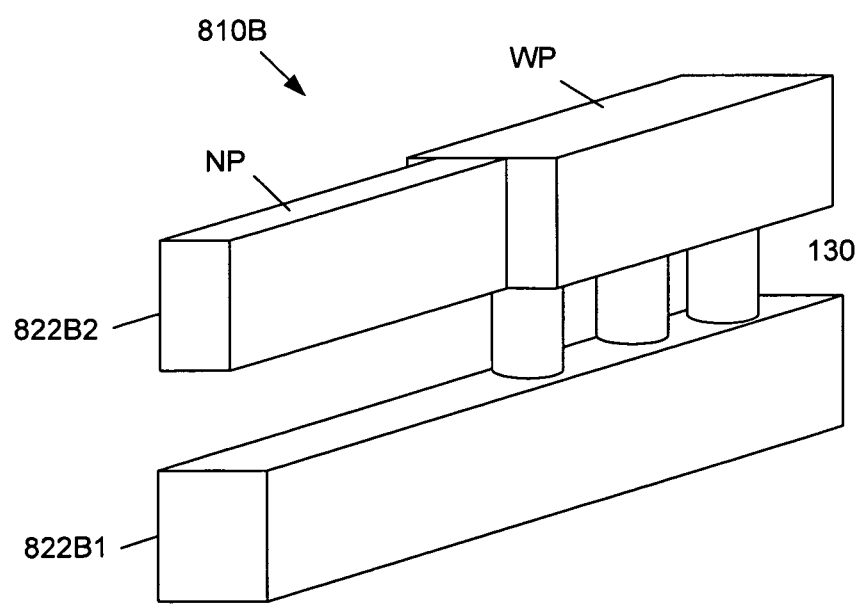
FIG. 11B shows a three dimensional view of a capacitor plate in accordance with an embodiment of the present invention.

Another embodiment is shown in FIGS. 11A and 11B. FIGS. 11A, 11B show a first capacitor plate 810A and a second capacitor plate 810B, respectively. The first capacitor plate 810A comprises an upper conductive strip 822A2 at least partially over a lower conductive strip 822A1. The upper conductive strip 822A2 comprises at least one wider portion WP and at least one narrower portion NP having a width less than the wider portion WP. The lower conductive strip 822A1 may have a substantially uniform width. The width of the lower strip may be between that of the wider portion WP and the narrower portion NP of the upper conductive strip 822A2. In the embodiment shown in FIG. 11A, the wider portion WP of the upper conductive strip 822A2 is electrically coupled to the lower strip 822A1. In one or more embodiments, there may not be any conductive vias coupled between the narrower portion NP of the upper strip 822A2 and the lower strip 822A1.

The second capacitor plate 810B comprises an upper conductive strip 822B2 at least partially over a lower conductive strip 822B1. The upper conductive strip 822B2 comprises at least one wider portion WP and at least one narrower portion NP having a width less than the wider portion WP. In an embodiment, the lower conductive strip may have a substantially uniform width. The lower strip 822B1 may have a width which is between that of the wider portion WP and the narrower portion NP of the upper conductive strip 822B2. In the embodiment shown in FIG. 11B, the wider portion WP of the upper conductive strip 822B2 is electrically coupled to the lower strip 822B1. In one or more embodiments, there may not be any conductive vias coupled between the narrower portion NP of the upper strip 822B2 and the lower strip 822B1.

In one or more embodiments, each of the conductive strips 822A1,A2 of a plate 810A may be substantially horizontally disposed. In an embodiment, the strip 822A2 may be above strip 822A1 in an ascending arrangement. In an embodiment, the ascending arrangement of conductive strips may be such that the plate 810A has a vertical component. For example, in one embodiment the plate 810A may be substantially vertically disposed. In another embodiment, the conductive strips may have a step-like arrangement so that the plate 810A has a vertical component but is tilted.

In one or more embodiments, each of the conductive strips 822B1,B2 of a plate 810B may be substantially horizontally disposed. In an embodiment, the strip 822B2 may be above the strip 822B1 in an ascending arrangement. In an embodiment, the ascending arrangement of conductive strips may be such that the plate 810B has a vertical component. For example, in one embodiment the plate 810B may be substantially vertically disposed. In another embodiment, the conductive strips may have a step-like arrangement so that the plate 810B has a vertical component but is tilted.

Figure 11C:
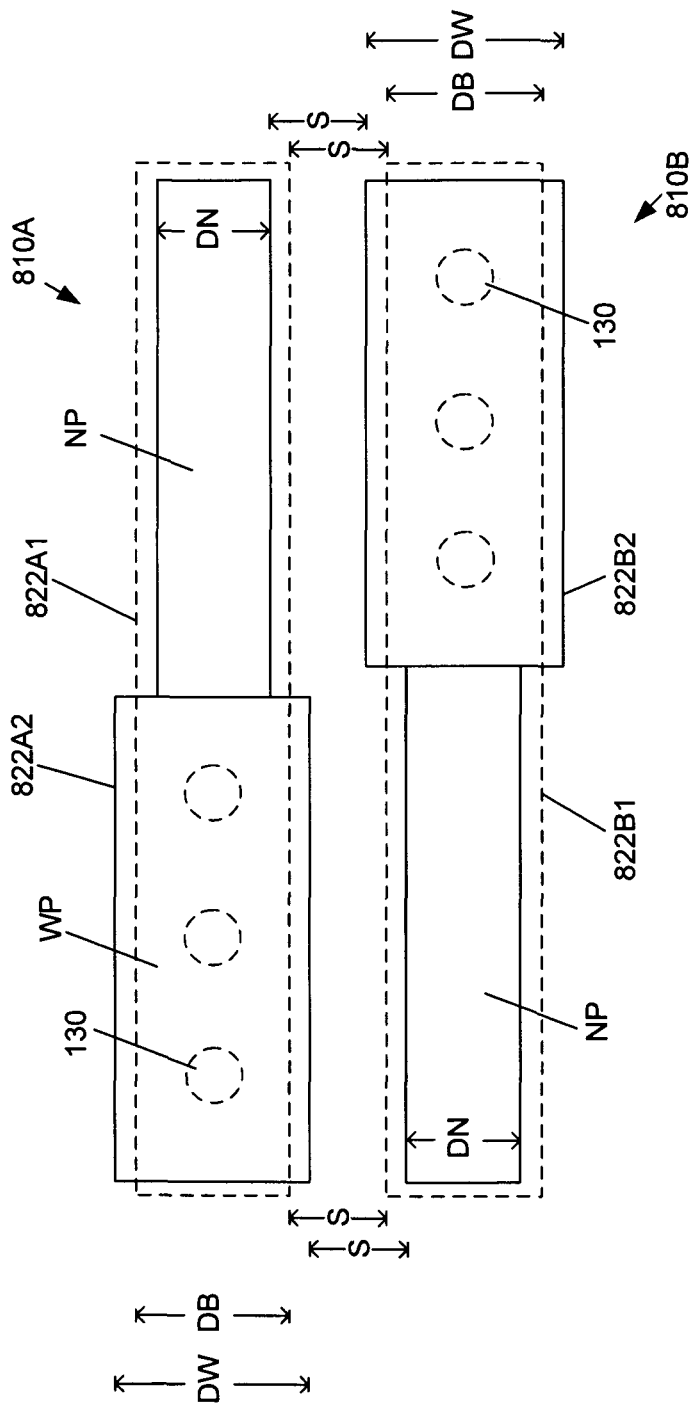
FIG. 11C shows a top view of a first capacitor plate adjacent a second capacitor plate in accordance with an embodiment of the present invention.

FIG. 11C shows an example of a top view of a first capacitor plate 810A disposed substantially parallel to and facing a second capacitor plate 810B. The first plate 810A includes an upper conductive strip 822A2 over a lower conductive strip 822A1 (dotted line). The upper strip 822A2 includes a wider portion WP having a width DW and a narrower portion NP having a width DN less than DW. The lower strip 822A1 has a substantially constant width DB. The width DB may be between the width DW and the width DN. As an example, width DB may be (DW+DN)/2.

The second plate 810B includes an upper conductive strip 822B2 at least partially over a lower conductive strip 822B1 (dotted line). The upper strip 822B2 includes a wider portion WP having a width DW and a narrower portion NP having a width DN less than DW. The lower strip 822B1 has a substantially constant width DB. The width DB may be between the width DW and the width DN. As an example, width DB may be (DW+DN)/2.

Referring to FIG. 11C, it is seen that the upper strip 822A2 may be separated from the upper strip 822B2 by a distance S. Likewise, the width of the lower strip 822A1 and the width of the lower strip 822B1 may be chosen so that the lower strip 822A1 may be separated from the lower strip 822B1 also separated by a distance S.

In the embodiment shown in FIG. 11C, the upper strip 822A2 may be substantially parallel with the lower strip 822A1. Likewise, the upper strip 822B2 may be substantially parallel with the lower strip 822B1.

Figure 11D:
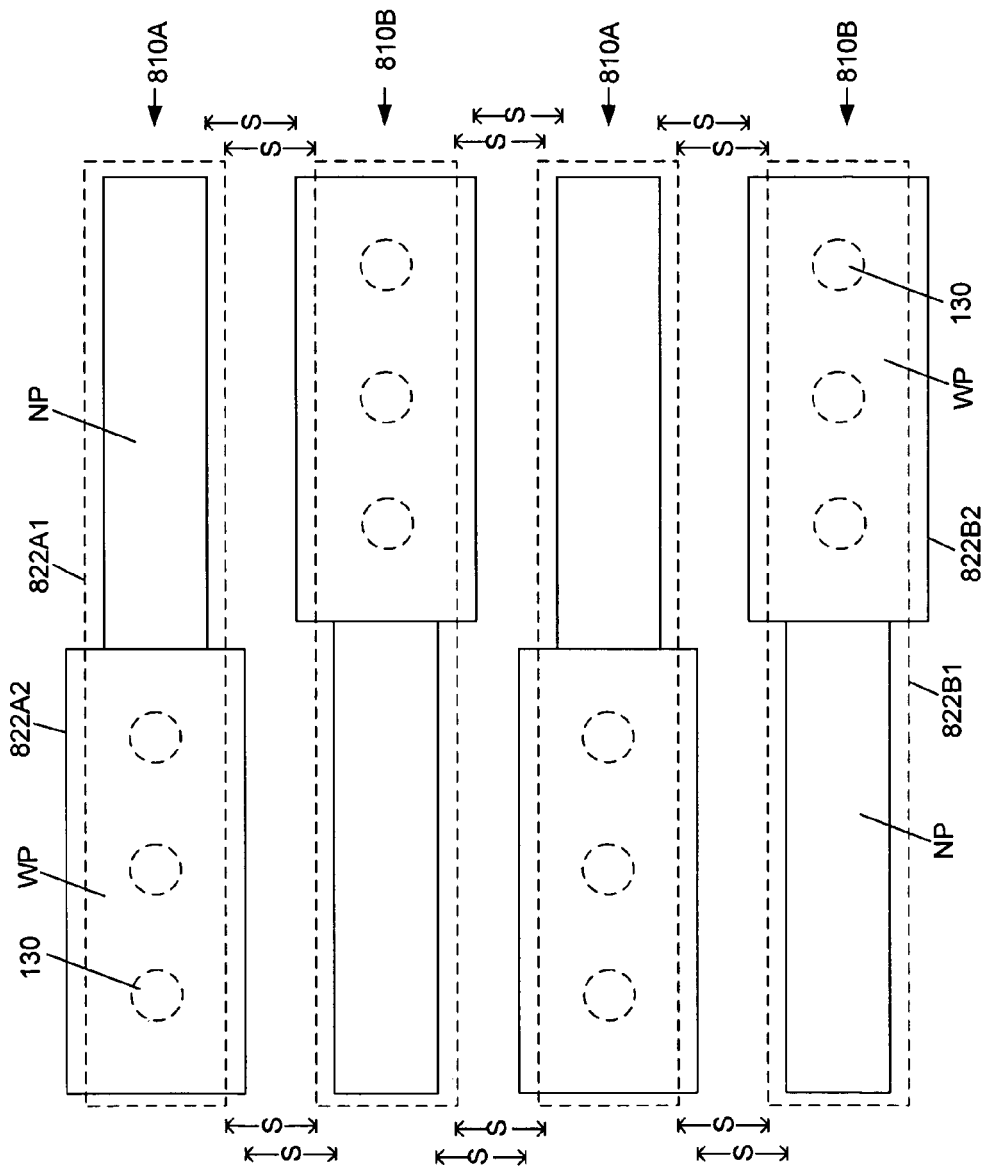
FIG. 11D shows a top view of a capacitor structure in accordance with an embodiment of the present invention.

Referring to FIG. 11C the first capacitor plate 810A may form a first electrode for a capacitor. Likewise, the second capacitor plate 810B may form a second electrode of the same capacitor. In an embodiment, two or more first plates 810A may be electrically coupled together to form a first electrode of a capacitor. In an embodiment, two or more second plates 810B may be electrically coupled together to form a second electrode of a capacitor. An example is shown in FIG. 11D which shows two first plates 810A and two second plates 810B alternately arranged. The two first plates 810A may be electrically coupled together to form a first electrode of a capacitor. The two second plates 810B may be electrically coupled together to form a second electrode of the same capacitor.

In one or more embodiments, the conductive strips 822A1, 822B1 may be part of a first metallization level. Likewise, the conductive strips 822A2, 822B2 may be part of a second metallization level above (e.g. at a higher level as) the first metallization level.

Figure 12:
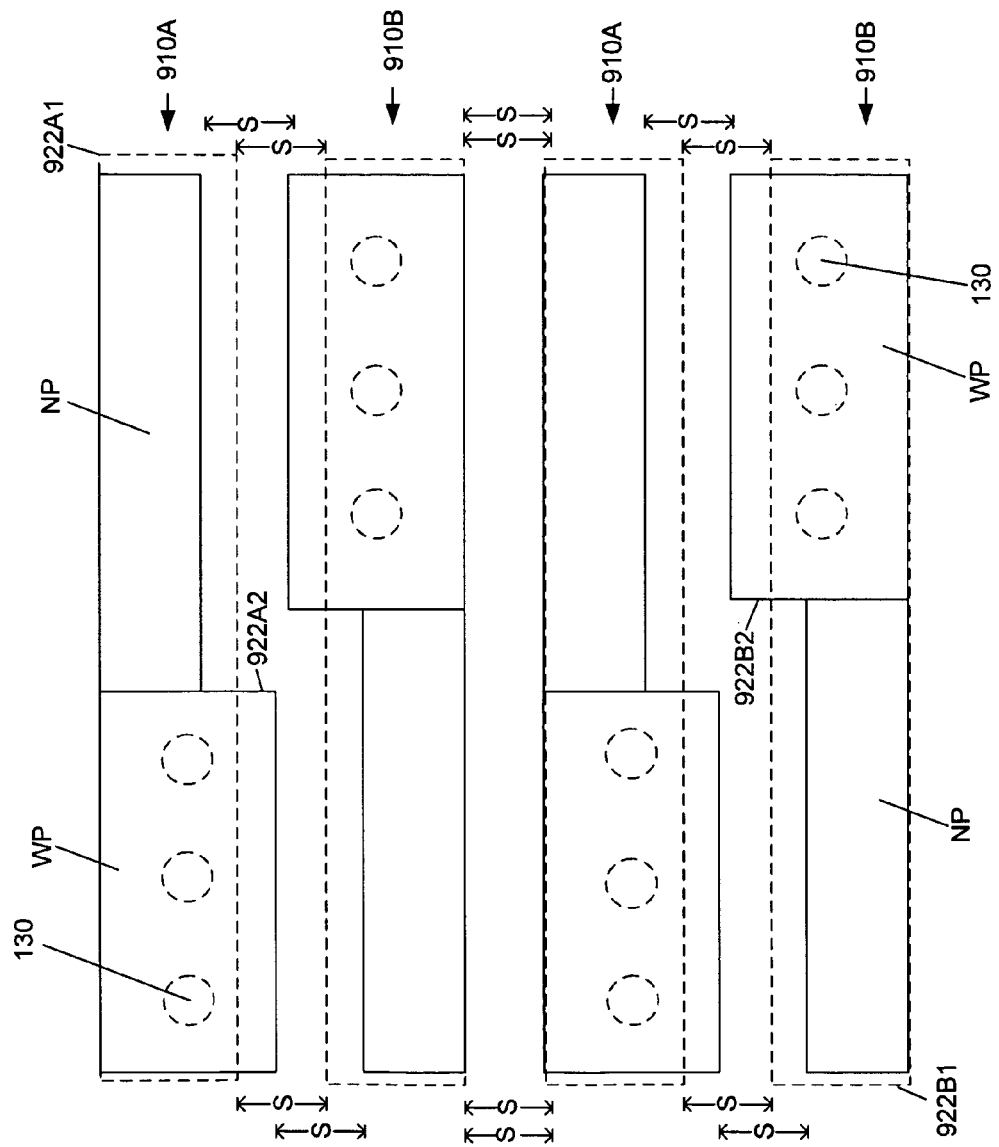
FIG. 12 shows a top view of a capacitor structure in accordance with an embodiment of the present invention.

Another embodiment of the invention is shown in FIG. 12. FIG. 12 shows a top view of two first plates 910A and two second plates 910B alternately arranged. The two first plates 910A may be electrically coupled together to form a first electrode of a capacitor. The two second plates 910B may be electrically coupled together to form a second electrode of the same capacitor. In other embodiments, there may be one or more first plates 910A and one or more second plates 910B. In one or more embodiments, there may be a plurality of first plates 910A. In one or more embodiments, there may be a plurality of second plates 910B.

Referring to FIG. 12, the first plate 910A includes an upper conductive strip 922A2 over a lower conductive strip 922A1 (dotted line). The upper strip 922A2 includes at least one wider portion WP having a width DW and at least one narrower portion NP having a width DN less than DW. The lower strip 922A1 has a substantially constant width DB. The width DB may be between the width DW and the width DN. As an example, width DB may be (DW+DN)/2.

The second plate 910B includes an upper conductive strip 922B2 at least partially over a lower conductive strip 922B1 (dotted line). The upper strip 922B2 includes at least one wider portion WP having a width DW and at least one narrower portion NP having a width DN less than DW. The lower strip 922B1 has a substantially constant width DB. The width DB may be between the width DW and the width DN. As an example, width DB may be (DW+DN)/2.

Referring to FIG. 12, it is seen that the upper strip 822A2 may be separated from the upper strip 922B2 by a distance S. Likewise, the width of the lower strip 922A1 and the width of the lower strip 922B1 may be chosen so that the lower strip 922A1 may be separated from the lower strip 922B1 also separated by a distance S.

In the embodiment shown in FIG. 12, the upper strip 922A2 may be substantially parallel with the lower strip 922A1. Likewise, the upper strip 922B2 may be substantially parallel with the lower strip 922B1.

In the embodiments presented herein of the first and second capacitor plates, one or more first conductive plates (for example, a plurality of first conductive plates) may be electrically coupled together to form a first electrode of a capacitor. Likewise, one or more second conductive plates (for example, a plurality of second conductive plates) may be electrically coupled together to form a second electrode of a capacitor.

In one or more embodiments, a capacitor of the present invention includes a first capacitor electrode and a second capacitor electrode. The first capacitor electrode may comprise one or more electrically coupled first capacitor plates. The second capacitor electrode may comprise one or more electrically coupled second capacitor plates. The capacitor plates may be arranged alternatingly such that a second plate follows a first plate and a first plate follows a second plate, etc. The first and second capacitor plates may be said to be opposite plates. In one or more embodiments, the capacitor plates may have any shape. In one or more embodiments, each of the capacitor plates of the first capacitor electrode and each of the capacitor plates of the second capacitor electrode may be vertically disposed. In one or more embodiments, the capacitor may be a vertical parallel plate capacitor.

In one or more embodiments, the first capacitor plate may include one or more conductive strips. In one or more embodiments, the first capacitor plate may include two or more conductive strips. In one or more embodiments, the second capacitor plate may include one or more conductive strips. In one or more embodiments, the second capacitor plate may include two or more conductive strips.

In one or more embodiments, the conductive strips of a first plate may be at the same level as the corresponding conductive strips of a second plate. For example, the conductive strips may be formed from conductive lines of the various metallization levels (e.g. Metal 1, Metal 2, Metal 3, etc.) of a semiconductor device.

At least one of the conductive strips of each first plate may include at least one wider portion WP and at least one narrower portion NP having a width less than that of the wider portion WP. In one or more embodiments, there may be a plurality of wider portions and a plurality of narrower portions. In one or more embodiments, the wider portions and the narrower portion may alternate along the length of the strip.

At least one of the conductive strips of each second plate may include at least one wider portion WP and at least one narrower portion NP having a width less than that of the wider portion WP. In one or more embodiments, there may be a plurality of wider portions and a plurality of narrower portions. In one or more embodiments, the wider portions and the narrower portions may alternate along the length of the strip.

In one or more embodiments, the widths of all of the wider portions of the same conductive strip may be the same. In one or more embodiments, the lengths of all of the wider portions of the same conductive strip may be the same. In one or more embodiments, the lengths of all of the narrow portions of the same conductive strip may be the same. In one or more embodiments, the lengths of all of the narrow portions of the same conductive strip may be the same. In one or more embodiments, the widths of all of the wider portions may be uniform along the length of a strip. In one or more embodiments, the widths of all of the narrow portions may be uniform along the length of a strip. In one or more embodiments, the narrower portions may form parallelepiped structures. In one or more embodiments, the wider portions may form parallelepiped structures.

In one or more embodiments, wider portion WP of a conductive strip may be the same as or may be different from the width of a wider portion WP of another conductive strip of the same plate. In one or more embodiments, the width of a wider portion WP of a conductive strip may be the same as or may be different from the width of a wider portion WP of a conductive strip of an opposite plate.

In one or more embodiments, the length of a narrower portion NP of a conductive strip may be the same as or may be different from the length of a narrower portion NP of another conductive strip of the same plate. In one or more embodiments, the length of a narrower portion NP of a conductive strip may be the same as or may be different from the length of a narrower portion NP of a conductive strip of an opposite plate. In one or more embodiments, the length of a wider portion WP of a conductive strip may be the same as or may be different from the length of a wider portion WP of another conductive strip of the same plate. In one or more embodiments, the length of a wider portion WP of a conductive strip may be the same as or may be different from the length of a wider portion WP of a conductive strip of an opposite plate.

In one or more embodiments, the length of a narrower portion NP of a conductive strip may be the same as or may be different from the length of a narrower portion NP of another conductive strip of the same plate. In one or more embodiments, the length of a narrower portion NP of a conductive strip may be the same as or may be different from the length of a narrower portion NP of a conductive strip of an opposite plate.

It is noted that, in one or more embodiments, it may be possible to combine one or more the capacitor plates described herein with any of the other of the capacitor plates described to form additional embodiments of capacitor structures. For example, it may be possible that any of the first plates described may be combined with any of the second plates described to form additional embodiments of capacitor structures. Referring, for example, to the embodiments of the first plates 210A, 310A, 410A, 510A, 610A, 710A, 810A, 910A in FIGS. 3 through 12, as well as the embodiments of the second plates 210B, 310B, 410B, 510B, 510B', 610B, 710B, 810B, 910B also shown in FIGS. 3 through 12, it may be possible that additional embodiments of capacitor structures be formed by combining one or more of the first plates shown with one of more of the second plates shown. To form still further embodiments of capacitor structures, it may be possible that the plate 110 shown in FIGS. 1 and 2 be combined with one of more of the other plates described above. Additional combinations and embodiments may also be possible.

Figure 13:
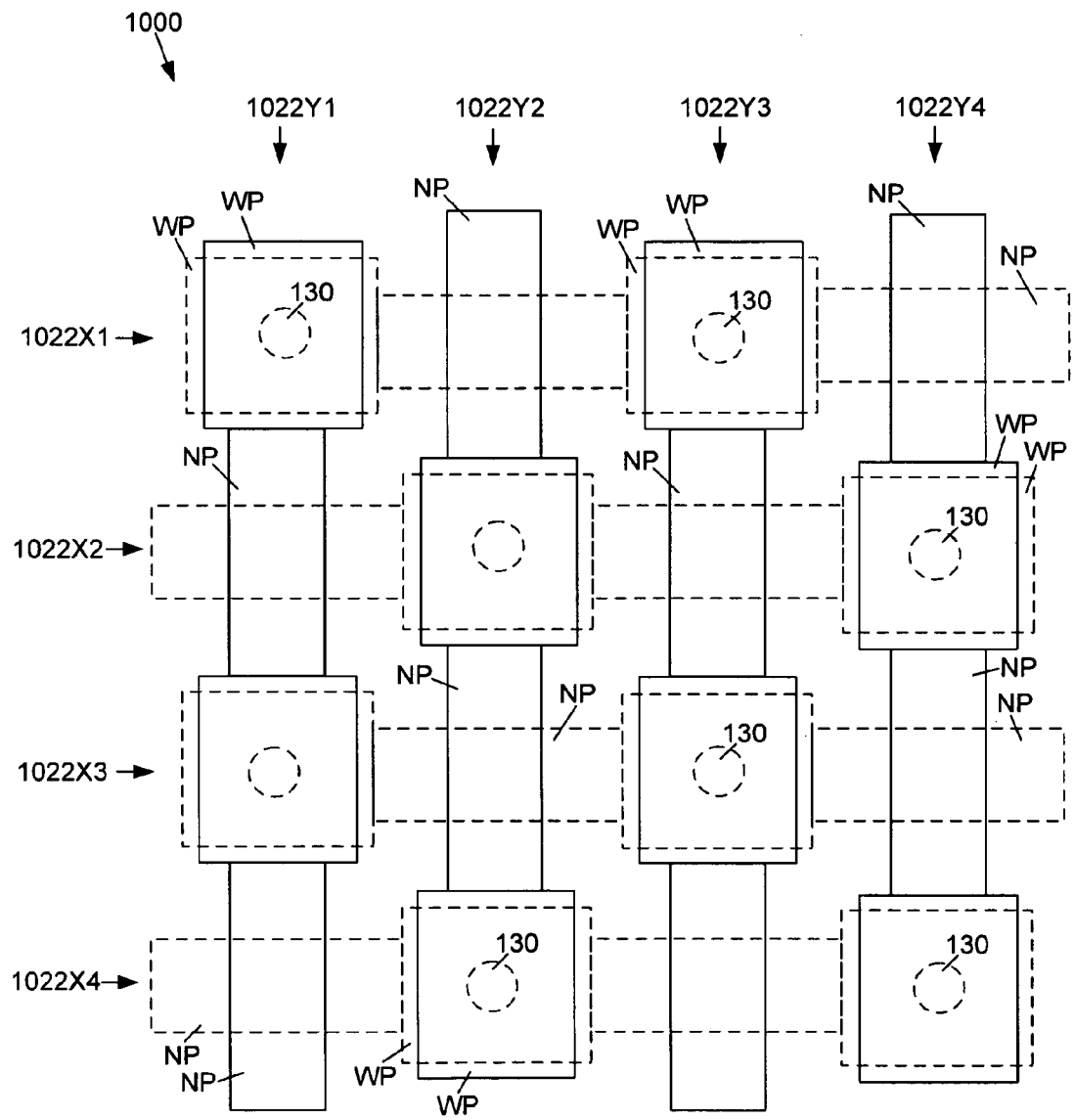
FIG. 13 shows a top view of a capacitor structure in accordance with an embodiment of the present invention.

FIG. 13 shows another embodiment of the present invention. FIG. 13 shows a top view of a capacitor structure 1000. The capacitor structure 1000 comprises upper conductive strips 1022Y1, 1022Y2, 1022Y3 and 1022Y4 (also referred to as upper strips 1022Y1,Y2,Y3,Y4). The capacitor structure 1000 comprises lower conductive strips 1022X1, 1022X2, 1022X3 and 1022X4 (also referred to as lower strips 1022X1,X2,X3,X4). Each of the upper conductive strips is disposed at least partially over each of the lower conducive strips.

The upper conductive strips 1022Y1, 1022Y3 are electrically coupled to the lower conductive strips 1022X1, 1022X3 through conductive vias 130 to form a first capacitor electrode. The first capacitor electrode may be in the form of a grid structure. The upper conductive strips 1022Y2, 1022Y4 are electrically coupled to the lower conductive strips 1022X2, 1022X4 through conductive vias 130 to form a second capacitor electrode which is spacedly disposed from the first capacitor electrode. The second capacitor electrode may also be in the form of a grid structure.

Generally, the first capacitor electrode may comprise at least one upper conductive strip and at least one lower conductive strip. In one or more embodiments, the first capacitor electrode may comprise a plurality of upper conductive strips. In one or more embodiments, the first capacitor electrode may comprise a plurality of lower conductive strips. In one or more embodiments, the upper conductive strips of the first electrode may be substantially perpendicular to the lower conductive strips of the first electrode.

Generally, the second capacitor electrode may comprise at least one upper conductive strip and at least one lower conductive strip. In one or more embodiments, the second capacitor electrode may comprise a plurality of upper conductive strips. In one or more embodiments, the second capacitor electrode may comprise a plurality of lower conductive strips. In one or more embodiments, the upper conductive strips may be substantially perpendicular to the lower conductive strips.

Referring to the embodiments of FIG. 13, each of the upper conductive strips 1022Y1,Y2,Y3,Y4 comprises at least one wider portion WP and a least one narrower portion NP. Likewise, each of the lower conductive strips 1022X1,X2,X3,X4 comprises at least one wider portion WP and at least one narrower portion NP. In one or more embodiments, each conductive strip may comprise a plurality of wider portions. In one or more embodiments, each conductive strip may comprise a plurality of narrower portions. In one or more embodiments, the wider portions may alternate with the narrower portions along the length of the strip.

Referring to the embodiment of FIG. 13, it is seen that wider portions WP of the upper conductive strip 1022Y1 may be coupled to the wider portion WP of lower conductive strip 1022X1 and to the wider portion of lower conductive strip 1022X3. Likewise, wider portions WP of upper strip 1022Y3 may be coupled to wider portion WP of lower strip 1022X1 and to wider portion WP of lower strip 1022X3. Hence, the strips 1022Y1, 1022Y3, 1022X1 and 1022X3 form a first capacitor electrode.

Referring to the embodiment of FIG. 13, it is seen that wider portions WP of the upper conductive strip 1022Y2 may be coupled to the wider portion WP of lower conductive strip 1022X2 and to the wider portion of lower conductive strip 1022X4. Likewise, wider portions WP of upper strip 1022Y4 are coupled to wider portion WP of lower strip 1022X2 and to wider portion WP of lower strip 1022X4. Hence, the strips 1022Y2, 1022Y4, 1022X2 and 1022X4 form a second capacitor electrode.

Generally, a wider portion WP of an upper strip may be electrically coupled to a wider portion WP of a lower strip by one or more conductive vias. In one or more embodiments, it is also possible that the wider portion of an upper conductive strip be electrically coupled to a narrower portion of a lower conductive strip.

Referring to the embodiment of FIG. 13, it is seen that each of the lower conductive strips 1022X1,X2,X3,X4 includes at least one wider portion WP and at least one narrower portion NP. However, in another embodiment, it is possible that one or more of the lower conductive strips may have a substantially uniform width. In one or more embodiments, it is possible that each of the lower conductive strips has a substantially uniform width.

Generally, the conductive strips and the conductive vias disclosed herein may comprise any conductive material. In one or more embodiments, the conductive material may comprise a metallic material. The metallic material may comprise a pure metal. The metallic material may comprise a metal alloy. The metallic material may comprise, without limitation, one or more elements from the group consisting of Al, Cu, Au, Ag, W, Ti, and Ta.

As possible examples, the conductive strips and/or the conductive vias may comprise one or more materials selected from the group consisting of pure aluminum, aluminum alloy, pure copper, copper alloy, pure gold, gold alloy, pure silver, silver alloy, pure tungsten, tungsten alloy, pure titanium, titanium alloy, pure tantalum, and tantalum alloy.

It is possible that the conductive vias and conductive strips be formed of a non-metallic conductive material. For example, the conductive material may be a doped polysilicon material (such as n-type doped or p-type doped). The conductive material may also be formed of a conductive polymer.

As noted above, the capacitor plates may comprise conductive strips. In one or more embodiments, each of the conductive strips may be formed of conductive lines or conductive layers belonging to various metallization levels of a semiconductor device. This includes, for example, metallization level 1, metallization level 2, etc. The metallization levels may be formed over a substrate.

In one or more embodiments, the conductive vias may, for example, be formed as conductive interconnects through the inter-level dielectric layers between one metallization level and another metallization layer. In one or more embodiments, the conductive vias may be formed as conductive interconnects through the dielectric between the substrate and the first metallization level (e.g. metallization level 1). In one or more embodiments, the conductive vias may be formed as conductive interconnections through the substrate (such as, for example, through-substrate vias or through-silicon vias).

The capacitor structures described herein may be formed over a substrate, on a substrate and/or within a substrate. The substrate may be any type of substrate. In an embodiment, the substrate may be a p-type substrate. However, more generally, in one or more embodiments of the invention, the substrate may be a silicon substrate or other suitable substrate. The substrate may be a bulk mono-crystallayer silicon substrate (or a grown thereon or otherwise formed therein), a of (110) silicon on a (100) silicon wafer, a silicon-on-insulator (SOI) substrate. The SOI substrate may, for example, be formed by a SIMOX process. The substrate may be a silicon-on-sapphire (SOS) substrate. The substrate may be a germanium-on-insulator (GeOI) substrate. The substrate may include one or more materials such as semiconductor materials such as silicon germanium, germanium, germanium arsenide, indium arsenide, indium arsenide, indium gallium arsenide, or indium antimonide.

The capacitor structures described herein may comprise a first capacitor electrode and a second capacitor electrode. The first and second capacitor electrode may be separated by a dielectric. The first electrode may be electrically coupled to a first node on the same chip (semiconductor device) as the capacitor or to a first node on a different chip from the capacitor. Likewise, the second capacitor electrode may be electrically coupled to a second node on the same chip as the capacitor or to a node on a chip which is different from the capacitor.

In one or more embodiments, conductive layers (such as metallization lines) which are above the capacitor, below the capacitor or on the same level as the capacitor may be used to electrically couple the first and second capacitor electrodes to nodes that are either on the same chip or on a different chip. In one or more embodiments, conductive vias and conductive contacts may also be used for purposes of electrical coupling.

The disclosure herein is presented in the form of detailed embodiments described for the purpose of making a full and complete disclosure of the present invention, and that such details are not to be interpreted as limiting the true scope of this invention as set forth and defined in the appended claims.

What is claimed is:

1. A semiconductor device, comprising:
a capacitor structure comprising:
a first capacitor electrode, said first electrode comprising a first conductive strip at least partially over a second conductive strip, said first strip of said first electrode including a wider portion having a first width and a narrower portion having a second width less than the first width, the wider portion of said first strip of said first electrode being electrically coupled to the second strip of said first electrode by one or more conductive vias; and
a second capacitor electrode spacedly disposed from said first capacitor electrode, said second electrode comprising a first conductive strip at least partially over a second conductive strip, said first strip of said first electrode including a wider portion having a first width and a narrower portion having a second width less than the first width, the wider portion of said first strip of said second electrode being electrically coupled to the second strip of said second electrode by one or more conductive vias, said wider portion of said first conductive strip of said first electrode and said narrower portion of said first conductive strip of said second capacitor electrode facing each other, said narrower portion of said first conductive strip of said first electrode and said wider portion of said first conductive strip of said second capacitor electrode facing each other, said first conductive strip of said first electrode including a first and a second wider portion separated by said narrower portion, said first conductive strip of said second electrode including a first and a second narrower portion separated by said wider portion.

2. The device of claim 1, wherein said second strip of said first electrode includes a wider portion having a first width and a narrower portion having a second width less than the first width.

3. The device of claim 2, wherein the wider portion of said first strip of said first electrode is electrically coupled to the wider portion of said second strip of said first electrode.

4. The device of claim 2, wherein the wider portion of said first strip of said first electrode is electrically coupled to the narrower portion of said first strip of said first electrode.

5. The device of claim 2, wherein said second strip of said second electrode includes a wider portion having a first width and a narrower portion having a second width less than the first width.

6. The device of claim 5, wherein the wider portion of said first strip of said first electrode is electrically coupled to the wider portion of said second strip of said first electrode, and wherein the wider portion of said first strip of said second electrode is electrically coupled to the wider portion of said second strip of said second electrode.

7. The device of claim 1, wherein said first strip of said first electrode is substantially parallel to the first strip of said second electrode, and wherein said second strip of said first electrode is substantially parallel to the second strip of said second electrode.

8. The device of claim 1, wherein said first strip of said first electrode is substantially perpendicular to the second strip of said first electrode, and wherein said first strip of said second electrode is substantially perpendicular to the second strip of said second electrode.

9. The device of claim 1, wherein the wider portion of the first strip of said first electrode is opposite the narrower portion of the first strip of said second electrode.

10. The device of claim 1, wherein said wider portion of said first strips of said first and second electrodes have a substantially uniform width, and wherein said narrower portion of said first strips of said first and second electrodes have a substantially uniform width.

11. The device of claim 1, wherein said second strip of said first electrode has a substantially uniform width, and said second strip of said second electrode has a substantially uniform width.

12. The device of claim 1, wherein said first electrode forms a grid structure and said second electrode forms a grid structure.

13. The device of claim 1, further comprising a dielectric between said first and said second capacitor electrodes.

14. The device of claim 1, wherein the wider portion of said first strip of said first electrode is one of a plurality of wider portions of said first strip of said first electrode and/or the wider portion of said first strip of said second electrode is one of a plurality of wider portions of said first strip of said second electrode.

15. The capacitor structure of claim 1, wherein the distance between said wider portion of said first conductive strip of said first elctrode and said narrower portion of said first conductive strip of said second electrode is the same as the distance between said narrower portion of said first conductive strip of said first electrode and said wider portion of said first conductive strip of said second electrode.

16. A semiconductor device, comprising:
a capacitor structure, said capacitor structure comprising:
a first capacitor electrode, said first electrode comprising at least one first capacitor plate, said first plate including at least a first conductive strip at least partially over a second conductive strip, said first strip of said first plate including a wider portion having a first width and a narrower portion having a second width less than the first width, the wider portion of said first strip of said first plate being electrically coupled to said second strip of said first plate by one or more conductive vias; and
a second capacitor electrode spacedly disposed from said first capacitor electrode, said second electrode comprising at least one second capacitor plate, said second plate including at least a first conductive strip at least partially over a second conductive strip, said first strip of said second plate including a wider portion having a first width and a narrower portion having a second width less than the first width, the wider portion of said first strip of said second plate being electrically coupled to said second strip of said second plate by one or more conductive vias, said wider portion of said first conductive strip of said first electrode and said narrower portion of said first conductive strip of said second capacitor electrode facing each other, said narrower portion of said first conductive strip of said first electrode and said wider portion of said first conductive strip of said second capacitor electrode facing each other, said first conductive strip of said first electrode including a first and a second wider portion separated by said narrower portion, said first conductive strip of said second electrode including a first and a second narrower portion separated by said wider portion.

17. The device of claim 16, wherein first plate is substantially parallel to said second plate.

18. The device of claim 16, wherein said first plate has a vertical component and said second plate has a vertical component.

19. The device of claim 18, wherein said first plate and said second plate are substantially vertically disposed.

20. The device of claim 16, wherein said second strip of said first plate includes a wider portion having a first width and a narrower portion having a second width less than the first width, and wherein said second strip of said second plate includes a wider portion having a first width and a narrower portion having a second width less than the first width.

21. The device of claim 20, wherein the wider portion of said first strip of said first plate is electrically coupled to the wider portion of said second strip of said first plate, and wherein the wider portion of said first strip of said second plate is electrically coupled to the wider portion of said second strip of said second plate.

22. The device of claim 16, wherein the second strip of said first plate has a substantially uniform width, and the second strip of said second plate has a substantially uniform width.

23. The device of claim 16, wherein said one or more conductive vias of said first plate is a plurality of conductive vias, and wherein said one or more conductive vias of said second plate is a plurality of conductive vias.

24. The device of claim 16, wherein the wider portion of said first strip of said first plate is opposite the narrower portion of the first strip of said second plate.

25. The device of claim 16, wherein said first strips, said second strips and said conductive vias of said first and second plates comprise a metallic material.

26. The device of claim 16, wherein said at least one first plate is a plurality of electrically coupled first plates and said at least one second plate is a plurality of electrically coupled second plates, said plurality of first plates and said plurality of second plates being alternatingly arranged.

27. The device of claim 16, wherein said first strip of said first plate includes a plurality of wider portions and a plurality of narrower portion, and wherein said second strips of said first plate includes a plurality of wider portions and a plurality of narrower portions.

28. The capacitor structure of claim 16, wherein the distance between said wider portion of said first conductive strip of said first electrode and said narrower portion of said first conductive strip of said second electrode is the same as the distance between said narrower portion of said first conductive strip of said first electrode and said wider portion of said first conductive strip of said second electrode.

29. A capacitor structure, comprising:
a plurality of substantially parallel capacitor plates, each of said plates including at least a first conductive strip at least partially over a second conductive strip, said first conductive strip of each of said plates including at least one wider portion having a first width and at least one narrower portion having a second width less than said first width, the wider portion of each of said first strips being electrically coupled to the second strip of the same plate by at least one conductive via, said capacitor plates being alternately electrically coupled together creating a first portion of plates and a second portion of plates, said first portion of plates forming a first electrode of said capacitor structure and said second portion of plates forming a second electrode of said capacitor structure, said wider portion of said first conductive strip of said first electrode and said narrower portion of said first conductive strip of said second capacitor electrode facing each other, said narrower portion of said first conductive strip of said first electrode and said wider portion of said first conductive strip of said second capacitor electrode facing each other,
each of said first conductive strips of said first portion of plates including said wider portion between a first and a second narrower portion, each of said first conductive strips of said second portion of plates including said narrower portion between a first and a second wider portion.

30. The capacitor structure of claim 29, wherein each of said second strips of each of said plates includes at least one wider portion and at least one narrower portion having a width less than the wider portion.

31. The capacitor structure of claim 29, wherein said conductive strips of each of said plates are substantially parallel to each other.

32. The capacitor structure of claim 29, wherein said at least one conductive via is a plurality of conductive vias.

33. The capacitor structure of claim 29, wherein the wider portions of said first strips of said first portion of plates are opposite the narrower portions of said first strips of said second portion of plates.

34. The capacitor structure of claim 29, further comprising a dielectric disposed between said plates.

35. The capacitor structure of claim 29, wherein each of said first strips of said first portion of plates includes a plurality of wider portions and a plurality of narrower portions, and wherein each of said first strips of said second portion of plates includes a plurality of wider portions and a plurality of narrower portions.

36. The capacitor structure of claim 29, wherein the distance between said wider portion of said first conductive strip of said first electrode and said narrower portion of said first conductive strip of said second electrode is the same as the distance between said narrower portion of said first conductive strip of said first electrode and said wider portion of said first conductive strip of said second electrode.

\* \* \* \* \*